US012627300B2

(12) United States Patent
Kang et al.

(10) Patent No.: US 12,627,300 B2
(45) Date of Patent: May 12, 2026

(54) METHOD AND APPARATUS FOR MAINTAINING COMMUNICATION PERFORMANCE IN CORRESPONDENCE WITH INTERNAL TEMPERATURE IN ELECTRONIC DEVICE

(71) Applicant: SAMSUNG ELECTRONICS CO., LTD., Suwon-si (KR)

(72) Inventors: Kihoon Kang, Suwon-si (KR); Hyungpil Kum, Suwon-si (KR); Donghwan Seo, Suwon-si (KR); Hyeonchang Son, Suwon-si (KR); Sejeong Oh, Suwon-si (KR); Jinbae Lee, Suwon-si (KR); Kyeongmun Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 18/884,990

(22) Filed: Sep. 13, 2024

(65) Prior Publication Data

US 2025/0007520 A1    Jan. 2, 2025

Related U.S. Application Data

(63) Continuation of application No. PCT/KR2023/002434, filed on Feb. 21, 2023.

(30) Foreign Application Priority Data

Mar. 15, 2022    (KR) ........................ 10-2022-0032264
Aug. 4, 2022     (KR) ........................ 10-2022-0097350

(51) Int. Cl.
*H03L 1/02*        (2006.01)
*G01S 19/23*       (2010.01)
(Continued)

(52) U.S. Cl.
CPC .............. *H03L 1/02* (2013.01); *G01S 19/235* (2013.01); *H03B 5/04* (2013.01); *H03B 5/32* (2013.01); *H03L 1/022* (2013.01); *H03L 1/028* (2013.01)

(58) Field of Classification Search
CPC .......... G01S 19/235; G06F 1/08; H03B 5/04; H03B 5/32; H03L 1/02; H03L 1/022; H03L 1/028
See application file for complete search history.

(56) References Cited

U.S. PATENT DOCUMENTS 6,697,016 B1    2/2004    Voor
6,928,275 B1    8/2005    Patrick et al.
(Continued)

FOREIGN PATENT DOCUMENTS

CN    110932718 A    3/2020
EP    3 158 644 B1   1/2024
(Continued)

OTHER PUBLICATIONS

International Search Report (PCT/ISA/210) issued on May 25, 2023 by the International Searching Authority in International Patent Application No. PCT/KR2023/002434.
(Continued)

*Primary Examiner* — Ryan Johnson
(74) *Attorney, Agent, or Firm* — Sughrue Mion, PLLC

(57) ABSTRACT

The electronic device according to an embodiment of the present disclosure can comprise: a communication circuit; an oscillator set to generate a clock related to the communication circuit; a plurality of electronic components arranged in the vicinity of the oscillator; a plurality of temperature sensing devices each corresponding to each of the plurality of electronic components; and a processor. According to one embodiment, the processor can operate to:
(Continued)

collect, from the plurality of temperature sensing devices, temperature data related to the plurality of electronic components; predict a temperature change related to the plurality of electronic components on the basis of the collected temperature data; determine, on the basis of the predicted temperature change, a reference electronic component to be referred to in the oscillator clock generation; and control the oscillator clock generation on the basis of temperature data on the determined reference electronic component.

20 Claims, 12 Drawing Sheets

(51) Int. Cl.
  *H03B 5/04* (2006.01)
  *H03B 5/32* (2006.01)

(56) References Cited

U.S. PATENT DOCUMENTS

| | | | | |
|---|---|---|---|---|
| 8,237,515 | B2 * | 8/2012 | Keating | H03L 1/028 |
| | | | | 331/158 |
| 8,729,977 | B2 | 5/2014 | Filipovic et al. | |
| 10,509,434 | B1 | 12/2019 | Kowalski | |
| 10,998,907 | B2 | 5/2021 | Sudo et al. | |
| 11,005,478 | B2 * | 5/2021 | Haneda | H03L 1/04 |
| 11,740,675 | B2 | 8/2023 | Kato et al. | |
| 2007/0291676 | A1 | 12/2007 | Berggren | |
| 2015/0039798 | A1 | 2/2015 | Witizius et al. | |
| 2018/0209750 | A1 | 7/2018 | Im et al. | |
| 2018/0219499 | A1 | 8/2018 | Kano et al. | |
| 2021/0320643 | A1 | 10/2021 | Hoang | |
| 2021/0373625 | A1 | 12/2021 | Koo et al. | |

FOREIGN PATENT DOCUMENTS

| | | | |
|---|---|---|---|
| JP | 2015-88811 | A | 5/2015 |
| JP | 6665802 | B2 | 3/2020 |
| KR | 10-2002-0008594 | A | 1/2002 |
| KR | 10-2005-0059218 | A | 6/2005 |
| KR | 10-2009-0029191 | A | 3/2009 |
| KR | 10-2018-0088193 | A | 8/2018 |
| KR | 10-2021-0037548 | A | 4/2021 |

OTHER PUBLICATIONS

Written Opinion (PCT/ISA/237) issued on May 25, 2023 by the International Searching Authority in International Patent Application No. PCT/KR2023/002434.
Communication dated May 14, 2025, issued by the European Patent Office in counterpart European Application No. 23770984.5.

* cited by examiner

METHOD AND APPARATUS FOR MAINTAINING COMMUNICATION PERFORMANCE IN CORRESPONDENCE WITH INTERNAL TEMPERATURE IN ELECTRONIC DEVICE

CROSS-REFERENCE TO RELATED APPLICATIONS

This application is a bypass continuation of International Application No. PCT/KR2023/002434, filed on Feb. 21, 2023, which is based on and claims priority to Korean Patent Application No. 10-2022-0032264, filed on Mar. 15, 2022, and Korean Patent Application No. 10-2022-0097350, filed on Aug. 4, 2022, in the Korean Intellectual Property Office, the disclosures of which are incorporated by reference herein in their entireties.

BACKGROUND

1. Field

Embodiments of the present disclosure relate to a method and an apparatus for maintaining performance (e.g., communication performance) of an electronic device in correspondence with an internal temperature of the electronic device.

2. Description of Related Art

In accordance with development of digital technologies, various types of electronic devices, such as a personal digital assistant (PDA), an electronic notebook, a smartphone, a tablet personal computer (PC), a wearable device and/or a laptop PC, are widely used. These electronic devices have been continuously developed in terms of hardware and/or software of the electronic devices to support and increase functions thereof.

Recently, an electronic device uses a sensor (e.g., a thermistor or a temperature sensor) capable of measuring a temperature inside the electronic device to monitor heat generation of the electronic device and provide information (e.g., heat generation information) related to the use of the electronic device, based on a monitoring result.

According to an embodiment, an electronic device may include a sensor (e.g., a thermistor) mounted therein through an electronic component (or semiconductor) or an instrument (e.g., a circuit board) to design a semiconductor and measure a temperature of the corresponding electronic component. According to an embodiment, in the electronic device, the thermistor may be designed as a chip and may represent a semiconductor configured to measure (or detect) a temperature using a principle that resistance changes depending on temperature. According to an embodiment, the electronic device may apply a voltage to the thermistor, convert a value according to voltage distribution into an electrical signal, and determine a temperature using the electrical signal through a processor.

Furthermore, various services are provided to electronic devices as a result of technology development and wireless network performance improvement. For example, recently, a positioning service using electronic devices has attracted attention. The positioning service may be a general term for identifying a location of user and providing various services based on the location. For example, conventional positioning services may include a location tracking service that tracks a location of a user by tracking a location of an electronic device through a global navigation satellite system (GNSS) and a geofencing service that determines entry or exit from a specific point-of-interest (POI). The GNSS may refer to a system configured to use a satellite and provide information on a location, altitude, and/or speed of an object on the ground. Recently, as electronic devices provide GNSS-based location function services, the importance of GNSS accuracy is emerging.

SUMMARY

One or more embodiments provide a method and an apparatus for maintaining performance (e.g., communication performance) of an electronic device in correspondence with an internal temperature of the electronic device.

One or more embodiments also provide a method and an apparatus for determining an electronic component related to clock occurrence (oscillation or generation) of an oscillator, based on temperature data of various electronic components in an electronic device and operating to cause the oscillator to generate an accurate clock, based on the temperature data of the determined electronic component.

One or more embodiments also provide a method and an apparatus for controlling clock generation of an oscillator, based on a temperature of a peripheral heat generation source (e.g., a PMIC, a PAM, a battery, and/or a processor) of the oscillator in an electronic device.

One or more embodiments also provide a method and an apparatus for controlling clock generation of an oscillator, based on temperature data related to a peripheral heat generation source of the oscillator and distance data between the peripheral heat generation source and the oscillator.

According to an aspect of an embodiment, there is provided an electronic device including a communication circuit, an oscillator configured to generate a clock corresponding to the communication circuit, a plurality of electronic components adjacent to the oscillator, a plurality of temperature sensing devices corresponding to the plurality of electronic components, respectively, and a processor connected to the communication circuit, the oscillator, the electronic components, and the temperature sensing devices, wherein the processor is configured to collect, from the plurality of temperature sensing devices, temperature data corresponding to the plurality of electronic components, predict a temperature change corresponding to the plurality of electronic components based on the collected temperature data, determine a reference electronic component to be referred to by the oscillator for clock generation, based on the predicted temperature change, and control the clock generation of the oscillator based on temperature data of the determined reference electronic component.

The processor may be further configured to collect the temperature data from the plurality of temperature sensing devices for each designated sample.

The processor may be further configured to determine a temperature change trend for each electronic component among the plurality of electronic components based on the temperature data corresponding to each of the plurality of electronic components, and predict a future temperature change for each electronic component among the plurality of electronic components based on the temperature change trend for each electronic component The processor may be further configured to determine an electronic component among the plurality of electronic components having a greatest temperature change range as the reference electronic component, based on the predicted temperature change corresponding to each electronic component among the plurality of electronic components.

The processor may be further configured to provide temperature data corresponding to the determined reference electronic component to the oscillator so that the oscillator is configured to generate a clock based on the temperature data of the determined reference electronic component.

The oscillator may be further configured to predict a future temperature change based on the temperature data from the processor, and generate a clock based on the predicted temperature change.

The processor may be further configured to control an operation of the oscillator based on first temperature data of a first electronic component having been designated as the reference electronic component, change the reference electronic component based on temperature data corresponding to each electronic component among the plurality of electronic components, and control an operation of the oscillator based on second temperature data of a second electronic component having been changed to a reference electronic component The processor may be further configured to obtain a weight for each electronic component of the plurality of electronic components, determine a weight priority, and determine the second electronic component corresponding to a highest priority weight as a reference electronic component, and wherein the weight may be proportional to a difference value between a maximum value and a minimum value in temperature data and inversely proportional to a distance between the oscillator and each of the electronic components.

The processor may be further configured to obtain the maximum value and the minimum value while shifting samples one sample at a time, the samples having been generated for a predetermined time period with respect to the temperature sensing devices corresponding to the plurality of electronic components, respectively, obtain the difference value based on a difference between the maximum value and the minimum value, obtain a weight for each electronic component among the plurality of electronic components based on the difference value and the distance between each electronic component and the oscillator, and determine a highest weight among the obtained weights for respective electronic components as the highest priority weight.

The processor may be further configured to determine whether an event corresponding to a change of the reference electronic component has occurred based on the predicted temperature change, and determine a change of the reference electronic component based on a temperature change preceding a temperature change of the oscillator among temperature changes of the plurality of electronic components, and wherein the event may include an event corresponding to a temperature change preceding a future temperature change of the oscillator among the temperature changes of the plurality of electronic components.

According to another aspect of an embodiment, there is provided an operating method of an electronic device, the method including collecting temperature data corresponding to a plurality of electronic components from a plurality of temperature sensing devices corresponding to the plurality of electronic components, respectively, predicting a temperature change with respect to the plurality of electronic components based on the collected temperature data, determining a reference electronic component to be referred to for clock generation of an oscillator based on the predicted temperature change, and controlling clock generation of the oscillator based on temperature data of the determined reference electronic component.

The predicting of the temperature change may include determining a temperature change trend for each electronic component among the plurality of electronic components based on the temperature data corresponding to each electronic component among the plurality of electronic components, and predicting a future temperature change for each electronic component among the plurality of electronic components based on the temperature change trend for each electronic component.

The determining of the reference electronic component may include determining an electronic component among the plurality of electronic components having a greatest temperature change range as the reference electronic component, based on the predicted temperature change for each electronic component among the plurality of electronic components.

The controlling of the clock generation of the oscillator may include providing temperature data corresponding to the determined reference electronic component to the oscillator so that the oscillator is configured to generate a clock based on the temperature data of the determined reference electronic component.

The method may further include controlling an operation of the oscillator based on first temperature data of a first electronic component having been designated as the reference electronic component, changing the reference electronic component based on temperature data corresponding to each electronic component among the plurality of electronic components, and controlling an operation of the oscillator based on second temperature data of a second electronic component having been changed to the reference electronic component.

The method may further include collecting the temperature data for each designated sample.

The method may further include predicting, by an oscillator, a future temperature change based on the temperature data, and generating a clock based on the predicted temperature change.

The method may further include obtaining a weight for each electronic component of the plurality of electronic components, determining a weight priority, and determining the second electronic component corresponding to a highest priority weight as a reference electronic component, and wherein the weight may be proportional to a difference value between a maximum value and a minimum value in temperature data and inversely proportional to a distance between the oscillator and each of the electronic components.

The method may further include obtaining the maximum value and the minimum value while shifting samples one sample at a time, the samples having been generated for a predetermined time period with respect to the temperature sensing devices corresponding to the plurality of electronic components, respectively, obtaining the difference value based on a difference between the maximum value and the minimum value, obtaining a weight for each electronic component among the plurality of electronic components based on the difference value and the distance between each electronic component and the oscillator, and determining a highest weight among the obtained weights for respective electronic components as the highest priority weight.

The method may further include determining whether an event corresponding to a change of the reference electronic component has occurred based on the predicted temperature change, and determining a change of the reference electronic component based on a temperature change preceding a temperature change of the oscillator among temperature changes of the plurality of electronic components, and wherein the event may include an event corresponding to a temperature change preceding a future temperature change of the oscillator among the temperature changes of the plurality of electronic components.

BRIEF DESCRIPTION OF DRAWINGS

In connection with the description of the drawings, like or similar reference numerals may be used for like or similar elements.

FIG. 9 is a view illustrating an example of arrangement of an oscillator and an electronic component in an electronic device according to an embodiment;

DETAILED DESCRIPTION

Figure 1:
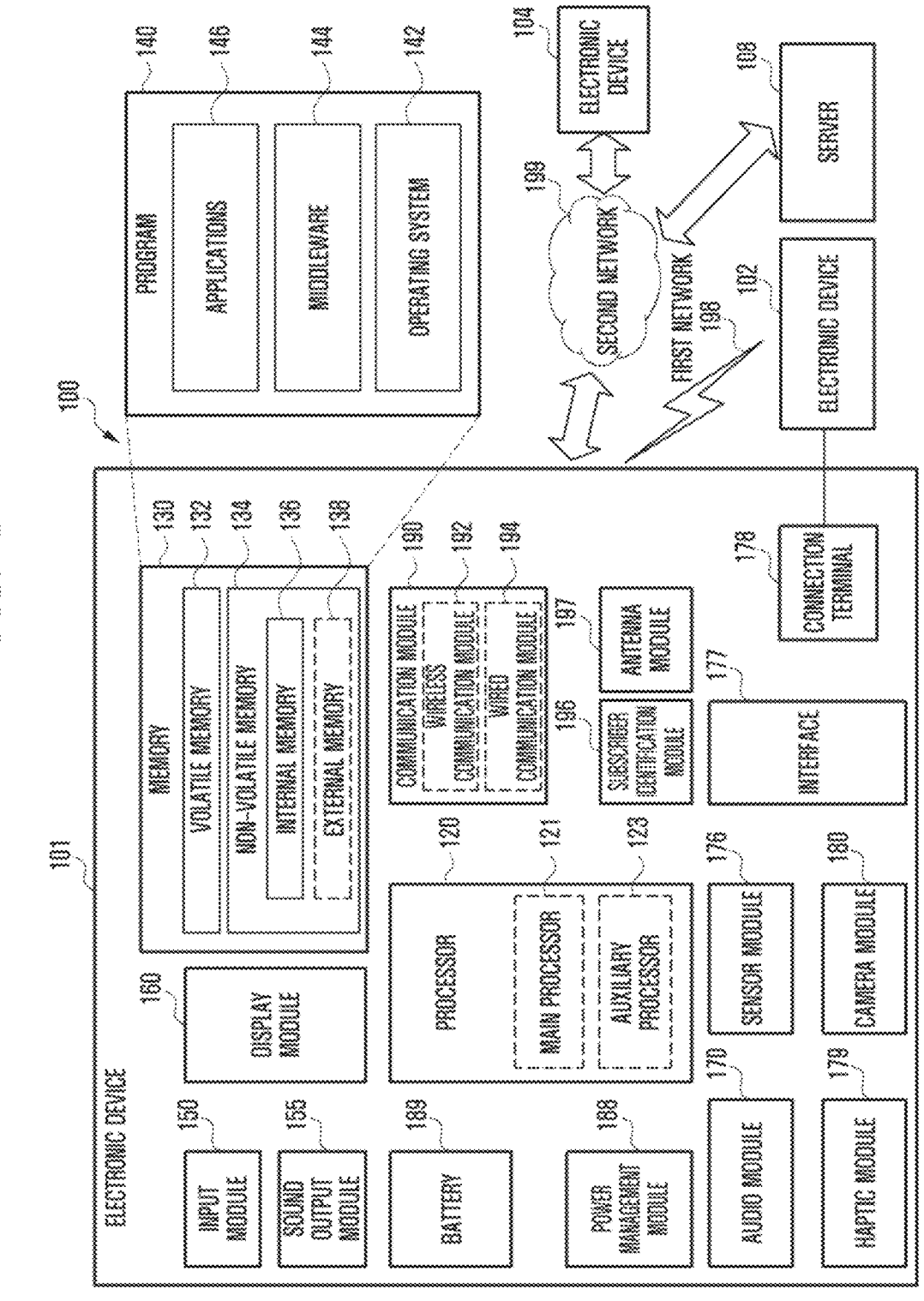
FIG. 1 is a block diagram illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
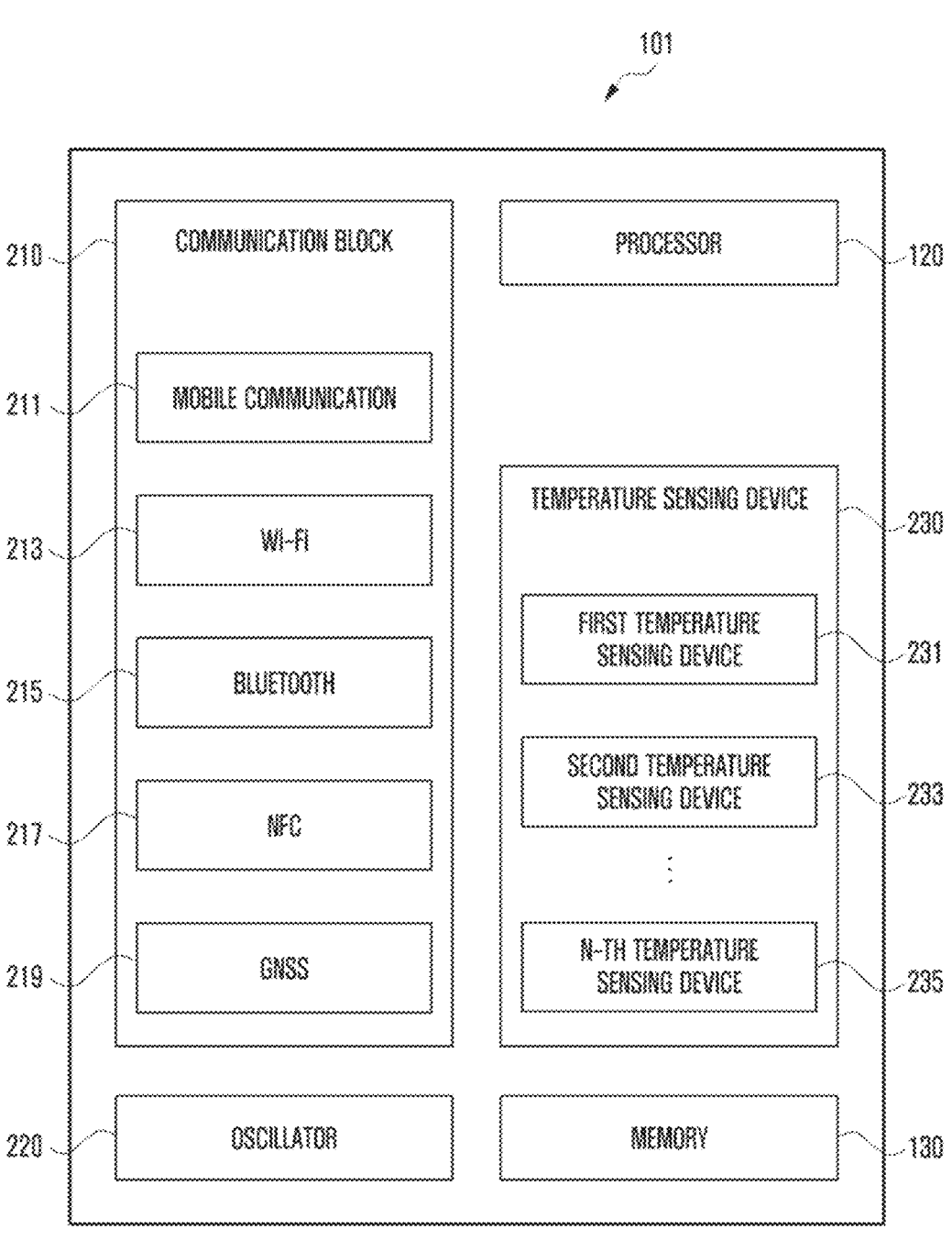
FIG. 2 is a view schematically illustrating a structure of an electronic device according to an embodiment.

FIG. 2 is a view schematically illustrating a structure of an electronic device according to an embodiment.

The electronic device 101 according to an embodiment may include a mobile terminal, a camera, a multimedia player, a laptop computer, a tablet personal computer (PC), a portable navigation device, and/or a navigation device which may be removably plugged into or integrated into a transport device, such as a car.

Referring to FIG. 2, the electronic device 101 according to an embodiment may include a communication block 210, an oscillator 220, a temperature sensing device 230, a memory 130, and a processor 120. According to an embodiment, the electronic device 101 may include one or more other components (e.g., the memory 130, the display module 160, the sensor module 176, the camera module 180, the power management module 188, and/or the battery 189 in FIG. 1). According to an embodiment, the electronic device 101 may receive power from a power supply device for operating each component (or function block) of the electronic device 101. The power supply device may include, for example, the battery 189, but is not limited thereto. For example, the electronic device 101 may include the entirety or a portion of components of the electronic device 101 described with reference to FIG. 1.

According to an embodiment, the communication block 210 may represent a configuration for performing mobile communication and/or short-range communication with an external electronic device. According to an embodiment, the communication block 210 may connect the electronic device 101 and another electronic device. According to an embodiment, the communication block 210 may connect the electronic device 101 and another network for voice and data communication.

According to an embodiment, the communication block 210 may operate to support cellular, wide area, local area, personal area, device to device (D2D), machine to machine (M2M), satellite, and short-range communication. A functional portion of the communication block 210 may be implemented as a chipset.

According to an embodiment, the communication block 210 of the electronic device 101 may include a mobile communication block 211, a wireless fidelity (Wi-Fi) communication block 213, a Bluetooth communication block 215, and a near field communication (NFC) block 217, and/or a global navigation satellite system (GNSS) communication block 219. According to an embodiment, the electronic device 101 may be implemented by further including many other communication blocks. According to an embodiment, the electronic device 101 may be implemented to include only the GNSS communication block 219. According to an embodiment, the various communication blocks mobile communication block 211, Wi-Fi block 213, Bluetooth block 215, NFC block 217, and GNSS block 219 within the communication block 210 include a communication circuit (communication circuitry), a processing circuit (processing circuitry), and/or executable program elements.

According to an embodiment, the mobile communication block 211 may support wide area network connection through direct or terrestrial-based transceiver stations (e.g., a base station (BS)) with other electronic devices by using technologies, such as D2D, M2M, long term evolution (LTE), fifth generation (5G), long term evolution advanced (LTE-A), code division multiple access (CDMA), wideband code division multiple access (WCDMA), universal mobile telecommunications system (UMTS), wireless broadband (WiBro), and global system for mobile communication (GSM).

According to an embodiment, the Wi-Fi communication block 213 may support local area network connection through a network access point (AP) using technology such as IEEE 802.11.

According to an embodiment, the Bluetooth communication block 215 may support direct network communication in the personal area using technology such as IEEE 802.15.

According to an embodiment, the NFC block 217 may support point-to-point short-range communication using standard technology such as ISO/IEC 14443.

According to an embodiment, the GNSS communication block 219 may include a GNSS receiver. For example, the GNSS communication block 219 may receive a signal (e.g., a satellite signal or GNSS signal) from an external transmitter (e.g., an artificial satellite) through the GNSS receiver. According to an embodiment, the GNSS communication block 219 may calculate (obtain) a location of the electronic device 101 by receiving a signal transmitted from the external transmitter.

In an embodiment, the external transmitter may be associated with at least one GNSS, such as a global positioning system (GPS), a global navigation satellite system (GLO-NASS), a Beidou navigation satellite system (Beidou), and a European global satellite-based navigation system (Galileo). According to an embodiment, the GNSS communication block 219 may be referred to, for example, as a GNSS receiver that receives a GNSS signal. According to an embodiment, the GNSS communication block 219 may receive location information of the electronic device 101 and transmit same to the processor 120.

According to an embodiment, the GNSS communication block 219 may receive a satellite signal to calculate a time, acceleration, speed, and/or absolute location of the electronic device 101. The GNSS communication block 219 may include at least one component, such as a processor (e.g., a microprocessor unit (MPU)), a receiver, a low noise amplifier (LNA), a downconverter, a mixer, a digital to analog converter (DAC), an analog to digital converter (ADC), a temperature sensing device (e.g., a thermistor), a filter, an accumulator, a calibration circuit, a storage, an oscillator (e.g., the oscillator 220 in FIG. 2), a radio frequency integrated circuit (RFIC), and a baseband integrated circuit (BBIC).

According to an embodiment, the oscillator 220 may include a processing circuit (processing circuitry) and/or executable program elements. According to an embodiment, the oscillator 220 may incur (or oscillate or generate) a clock for the communication block 210. According to an embodiment, the oscillator 220 may be expressed as, for example, a clock generator, a crystal oscillator, or an oscillator (XO). According to an embodiment, the oscillator 220 may include a sensor (or a temperature sensing device or thermistor) capable of sensing a temperature of the oscillator 220, and compensate for a clock generated according to a value of the sensor. According to an embodiment, the oscillator 220 may generate a clock by oscillating at a configured frequency per second. For example, a crystal oscillator (or XO) having a frequency of several MHz to tens of MHz (e.g., about 8 MHz to about 16 MHz) per second may be applied as the oscillator 220.

According to an embodiment, the temperature sensing device 230 may sense a temperature of a corresponding electronic component within the electronic device 101 and transfer a sensed result (e.g., temperature data or temperature information) to at least one designated processor (e.g., the processor 120 and/or the processor respectively corresponding to the communication block 210 in FIG. 1 or 2). According to an embodiment, the temperature sensing device 230 may be associated with at least some of the components of the electronic device 101. For example, the temperature sensing device 230 may be included in an electronic component (e.g., the electronic component 340 in FIGS. 3 to 7) disposed adjacent to the oscillator 220 inside the electronic device 101.

According to an embodiment, the temperature sensing device 230 may be configured for each corresponding electronic component to sense a temperature of the electronic component that generates heat (e.g., a heat source) inside the electronic device 101. For example, according to an embodiment, the temperature sensing device 230 may be designed as a chip with each electronic component, and sense a temperature of the corresponding electronic component. For example, the temperature sensing device 230 may include a first temperature sensing device 231 configured to sense a temperature of a first electronic component, a second temperature sensing device 233 configured to sense a temperature of a second electronic component, and an N-th temperature sensing device 235 configured to sense a temperature of an N-th electronic component. According to an embodiment, the temperature sensing device 230 may be expressed as a thermistor.

According to an embodiment, the electronic device 101 may include a memory 130. According to an embodiment, the memory 130 may store various data used by the electronic device 101. In an embodiment, the data may include, for example, an application (e.g., the program 140 in FIG. 1) and input data or output data with respect to a command related to the application. In an embodiment, the data may include, for example, temperature data acquired from a temperature sensing device corresponding to an electronic component, distance data related to a physical distance between the oscillator 220 and an electronic component disposed around the oscillator 220, and/or function data related to a weight calculation of the processor 120.

According to an embodiment, the memory 130 may store instructions, when executed, causing the processor 120 to operate. For example, the application may be stored as software (e.g., the program 140 in FIG. 1) in the memory 130 and may be executable by the processor 120. According to an embodiment, the application may include various applications that may provide various services (e.g., positioning service) in the electronic device 101.

According to an embodiment, the processor 120 may perform an application layer processing function required by the user of the electronic device 101. According to an embodiment, the processor 120 may provide a command and control of functions for various blocks of the electronic device 101. According to an embodiment, the processor 120 may perform control of respective components of the electronic device 101 and/or calculation or data processing related to communication. For example, the processor 120 may include at least a portion of configurations and/or functions of the processor 120 in FIG. 1. The processor 120 may be operatively connected, for example, to components of the electronic device 101. The processor 120 may load a command or data received from other components of the electronic device 101 into the memory 130, process the command or data stored in the memory 130, and store result data.

According to an embodiment, the processor 120 may include a processing circuit (processing circuitry) and/or executable program elements. According to an embodiment, the processor 120 may control (or process) an operation related to improving communication performance (e.g., GNSS performance) of the electronic device 101. According to an embodiment, the processor 120 may perform an operation of collecting data (e.g., temperature information) corresponding to the electronic component, an operation of predicting a temperature change in the electronic component based on the collected data, an operation of determining a reference electronic component to be referred to for clock generation of the oscillator 220 corresponding to each communication block 210 based on the predicted temperature change, and an operation of controlling the oscillator

220 to generate a clock based on data (e.g., temperature information) of the determined reference electronic component.

According to an embodiment, the electronic component may represent a plurality of peripheral electronic components arranged adjacent to each other based on the oscillator 220 corresponding to each component of the communication block 210. According to an embodiment, the data (e.g., temperature information) corresponding to the electronic component may include a plurality of data each acquired from a temperature sensing device for each electronic component. According to an embodiment, the processor 120 may receive a sample (e.g., temperature data) generated during a predetermined time period (e.g., about 5 seconds) for each temperature sensing device for each electronic component and predict a temperature change related to the electronic component based on the received sample.

According to an embodiment, as an operation related to improving communication performance (e.g., GNSS performance) of the electronic device 101, the processor 120 may initially operate so that the oscillator 220 generates a corresponding clock based on data of a first electronic component designated as the reference electronic component. While operating based on data from the first electronic component, the processor 120 may continuously collect data from a temperature sensing device corresponding to a surrounding electronic component, monitor a temperature change in the surrounding electronic component based on the collected data, predict a temperature change in the electronic component, determine whether a future event will occur based on a predicted result, calculate a weight based on determining the occurrence of an event, determine a priority of the weight, change a second electronic component corresponding to a highest priority weight to a reference electronic component, and operate so that the oscillator 220 generates a corresponding clock based on the data of the second electronic component having been changed to the reference electronic component.

According to an embodiment, the operation of the processor 120 of the electronic device 101 will be described with reference to the drawings described below.

According to an embodiment, operations performed by the processor 120 may be implemented as a recording medium (or computer program product). For example, the recording medium may include a non-transitory computer-readable recording medium configured to store a program for executing various operations performed by the processor 120.

The embodiments may be implemented in a recording medium readable by a computer or similar device using software, hardware, or a combination thereof. According to hardware implementation, the operations described in an embodiment may be implemented using at least one of application specific integrated circuits (ASICs), digital signal processors (DSPs), digital signal processing devices (DSPDs), programmable logic devices (PLDs), and field programmable gate arrays (FPGAs), processors, controllers, micro-controllers, microprocessors, and/or other electrical units to perform functions.

In an embodiment, the recording medium (or computer program product) may include a computer-readable recording medium configured to store a program for executing an operation of collecting temperature data related to a plurality of electronic components from a plurality of temperature sensing devices respectively corresponding to the plurality of electronic components, an operation of predicting a temperature change with respect to the plurality of electronic components based on the collected temperature data, an operation of determining a reference electronic component to be referred to for clock generation of an oscillator based on the predicted temperature change, and an operation of controlling clock generation of the oscillator based on temperature data of the determined reference electronic component.

Hereinafter, an example of designs for improving communication performance (e.g., GNSS performance) in the electronic device 101 according to various embodiments will be described, but embodiments are not limited to GNSS. For example, various embodiments described below merely present a specific component (e.g., GNSS) to explain the technical features of the disclosure and help understanding of the disclosure and are not intended to limit the scope of the disclosure. Therefore, the scope of the disclosure should be construed as encompassing all changes or modifications derived from the technical ideas of the disclosure in addition to the embodiments disclosed herein. For example, the design for improving GNSS performance described below may be applied to the components of the communication block 210 shown in FIG. 2 to improve communication performance based on ambient temperature information.

Figure 3:
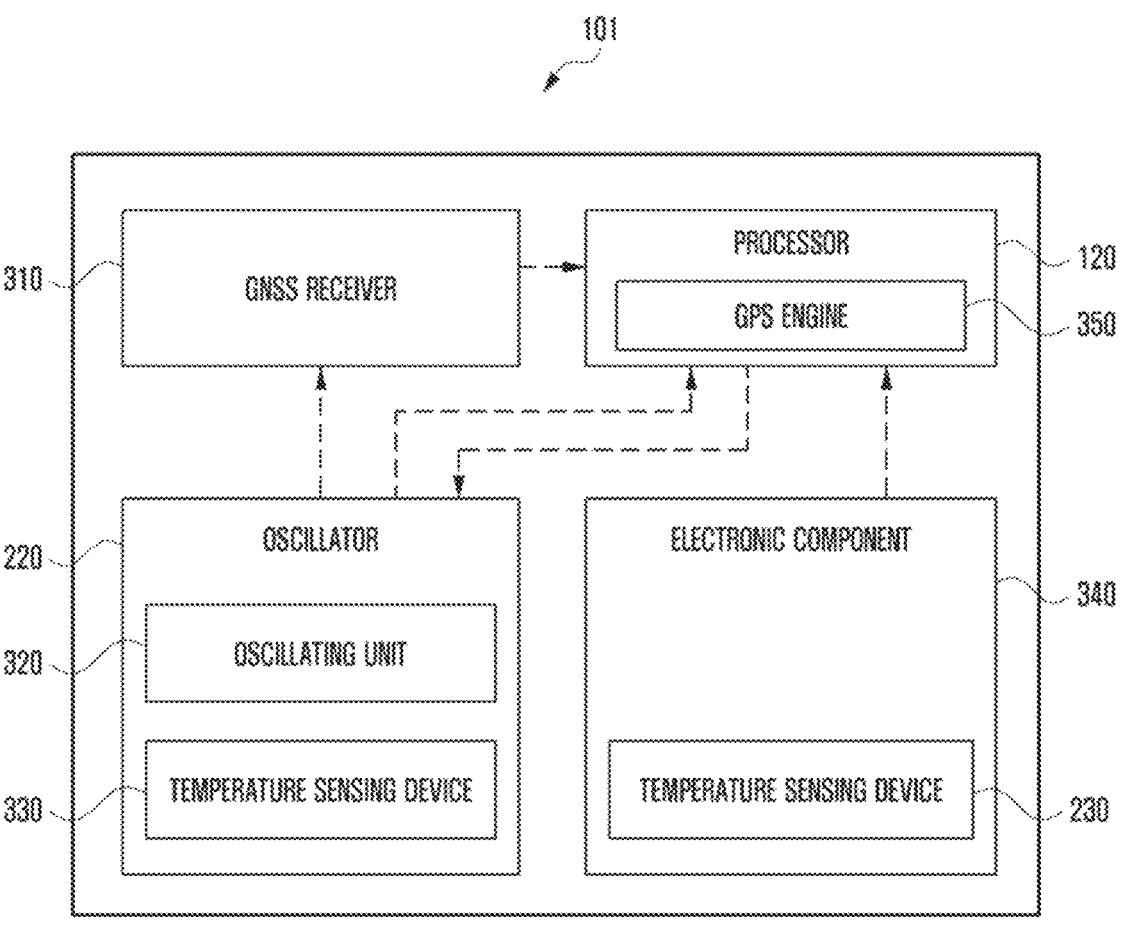
FIG. 3 is a view schematically illustrating an example of a block configuration for improving communication performance in an electronic device according to an embodiment.

FIG. 3 is a view schematically illustrating an example of a block configuration for improving communication performance in an electronic device according to an embodiment.

According to an embodiment, FIG. 3 may show an exemplary design in which a GNSS communication block 219 serves as a GNSS receiver 310, and a processor 120 separately configured from the GNSS receiver 310 processes a calculation related to improving GNSS performance.

Referring to FIG. 3, the electronic device 101 according to an embodiment may include the GNSS receiver 310, an oscillator 220, an electronic component 340, and a processor 120. According to an embodiment, the electronic device 101 may include one or more other components (e.g., the memory 130, the display module 160, the sensor module 176, the camera module 180, the power management module 188, and/or the battery 189). According to an embodiment, the configuration of the electronic device 101 shown in FIG. 3 includes components corresponding to the components (e.g., the oscillator 220, the temperature sensing device 230, the processor 120, and the GNSS communication module 219) as described in the description with reference to FIG. 2, and redundant descriptions will be omitted.

According to an embodiment, the GNSS receiver 310 may receive a GNSS signal (e.g., a satellite signal) from an external transmitter (e.g., an artificial satellite).

According to an embodiment, the oscillator 220 may generate a clock (e.g., a clock related to the GNSS receiver 310) inside the electronic device 101. According to an embodiment, the oscillator 220 may include an oscillating unit 320 and a temperature sensing device 330.

In an embodiment, the oscillator 320 may generate a clock for the GNSS receiver 310. According to an embodiment, the oscillating unit 320 may generate a designated frequency when a voltage is applied.

According to an embodiment, the temperature sensing device 330 may sense a temperature inside the oscillator 220. According to an embodiment, the temperature sensing device 330 of the oscillator 220 may sense an internal temperature of the oscillator 220 and transmit a sensing result (e.g., temperature information of the oscillator 220) to the processor 120.

According to an embodiment, the electronic component 340 may include various electronic components located around the oscillator 220 inside the electronic device 101. According to an embodiment, the electronic component 340 may include a temperature sensing device 230. According to an embodiment, the temperature sensing device 230 of the electronic component 340 may sense an internal temperature of the electronic component 340 and transmit a sensing result (e.g., temperature information of the electronic component 340) to the processor 120.

According to an embodiment, the processor 120 may include a GPS engine 350 configured to determine movement and/or a geographical location of the electronic device 101 by using the GNSS receiver 310 and searching for an object. For example, the processor 120 may be implemented in one chip with the GPS engine 350. According to an embodiment, the processor 120 may convert an analog signal corresponding to a GNSS signal into a digital signal based on the GPS engine 350 and process the signal.

According to an embodiment, the processor 120 may acquire temperature information from the oscillator 220 and the electronic component 340 and generate a control signal to control clock generation of the oscillator 220 based on the acquired temperature information. According to an embodiment, the processor 120 may acquire first temperature information from the temperature sensing device 330 of the oscillator 220, and generally concurrently acquire second temperature information from the temperature sensing device 340 of the electronic component 340.

According to an embodiment, the processor 120 may acquire third temperature information of the processor 120 from a temperature sensing device separate from the processor 120. For example, the processor 120 of the electronic device 101 may be the electronic component 340.

In an embodiment, a plurality of electronic components 340 may be provided, and there may be a plurality of temperature sensing devices 240 corresponding to the electronic components 340. According to an embodiment, the second temperature information may include a plurality of temperature information provided from a plurality of temperature sensing devices 240.

According to an embodiment, the processor 120 may determine a heat generation source (e.g., an electronic component having highest temperature information) having a greatest change range in heat generation from among various heat generation sources (e.g., the oscillator 220, the electronic component 340, and/or the processor 120), based on first temperature information, second temperature information, and third temperature information. According to an embodiment, the processor 120 may transfer a control signal for tuning a clock of the oscillator 220 to the oscillator 220 in response to temperature information of the heat source.

According to an embodiment, the oscillator 220 may receive the control signal from the processor 120 and operate to cause a clock to be generated by the oscillating unit 320 based on the received control signal. For example, the oscillating unit 320 may tune the clock for the GNSS receiver 310 based on temperature information.

As shown in FIG. 3, the electronic device 101 according to an embodiment may not fixedly use temperature information (e.g., temperature information of the oscillator 220 or temperature information of the processor 120) of one designated electronic component (e.g., the oscillator 220 or the processor 120). According to an embodiment, the electronic device 101 may adjust clock generation of the oscillator 220 by considering temperature information of various electronic components 340 that may affect an operation of the oscillator 220. For example, the electronic device 101 may refer to a temperature change of the oscillator 220, a first electronic component (e.g., a PAM), a second electronic component (e.g., a PMIC), and a third electronic component (e.g., the processor 120) and operate, based on an offset corresponding to temperature information having a great temperature change, to cause the oscillating unit 220 of the oscillator 320 to generate a uniform clock.

Figure 4:
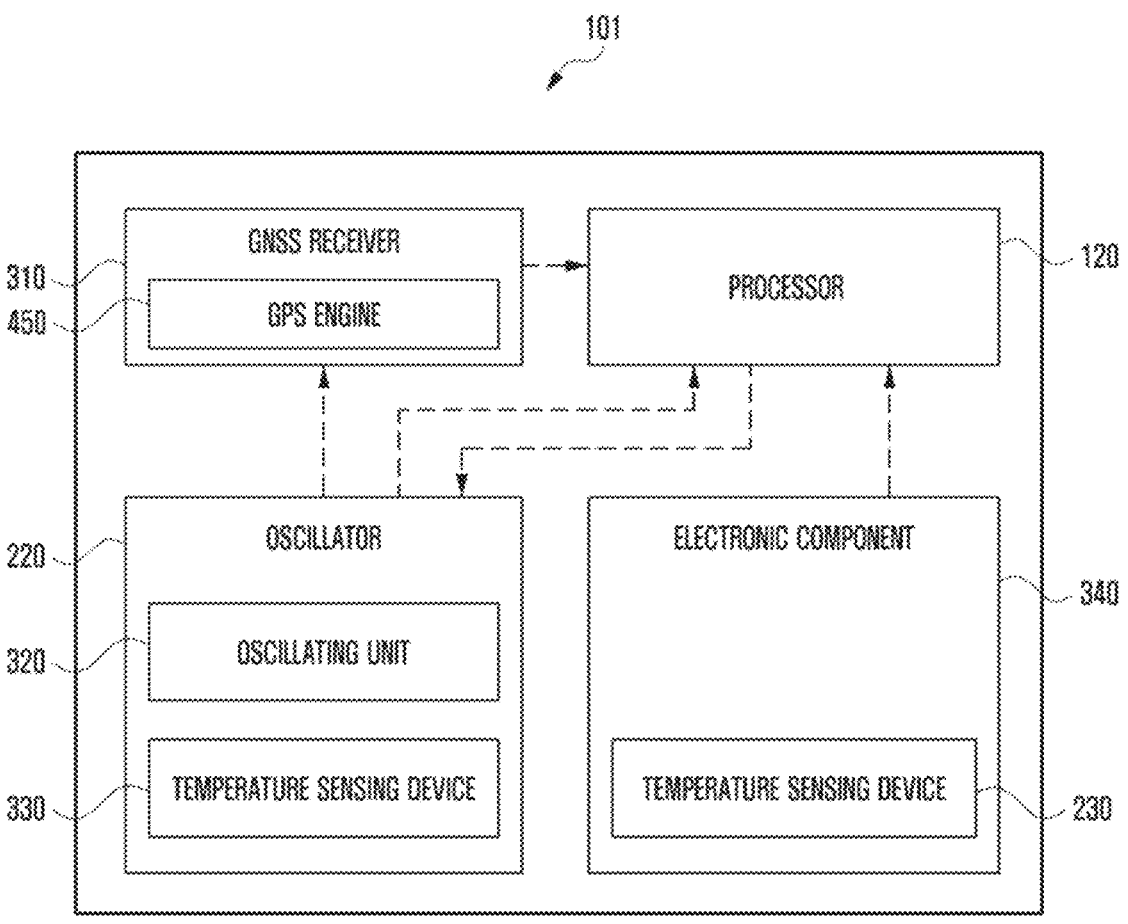
FIG. 4 is a view schematically illustrating an example of a block configuration for improving communication performance in an electronic device according to an embodiment.

FIG. 4 is a view schematically illustrating an example of a block configuration for improving communication performance in an electronic device according to an embodiment.

According to an embodiment, FIG. 4 may show an exemplary design in which a GNSS communication block 219 serves as a GNSS receiver 310 and includes a GPS engine 450 capable of processing a GNSS signal, and a processor 120 separately configured from the GNSS receiver 310 processes a calculation related to improving GNSS performance.

According to an embodiment, the components shown in FIG. 4 may correspond to the components described in the description with reference to FIGS. 2 and 3, with the difference that the GNSS receiver 310 includes the GPS engine 450, and other components and operations thereof may correspond to the components and the operations thereof in FIGS. 2 and 3.

For example, FIG. 4 may show an example of a structure in which the GNSS receiver 310 is configured in a single chip together with the GPS engine 450, and the GNSS receiver 310 processes from tracking the GNSS signal reception to performing analog-digital (AD) conversion corresponding to the GNSS signal.

Figure 5:
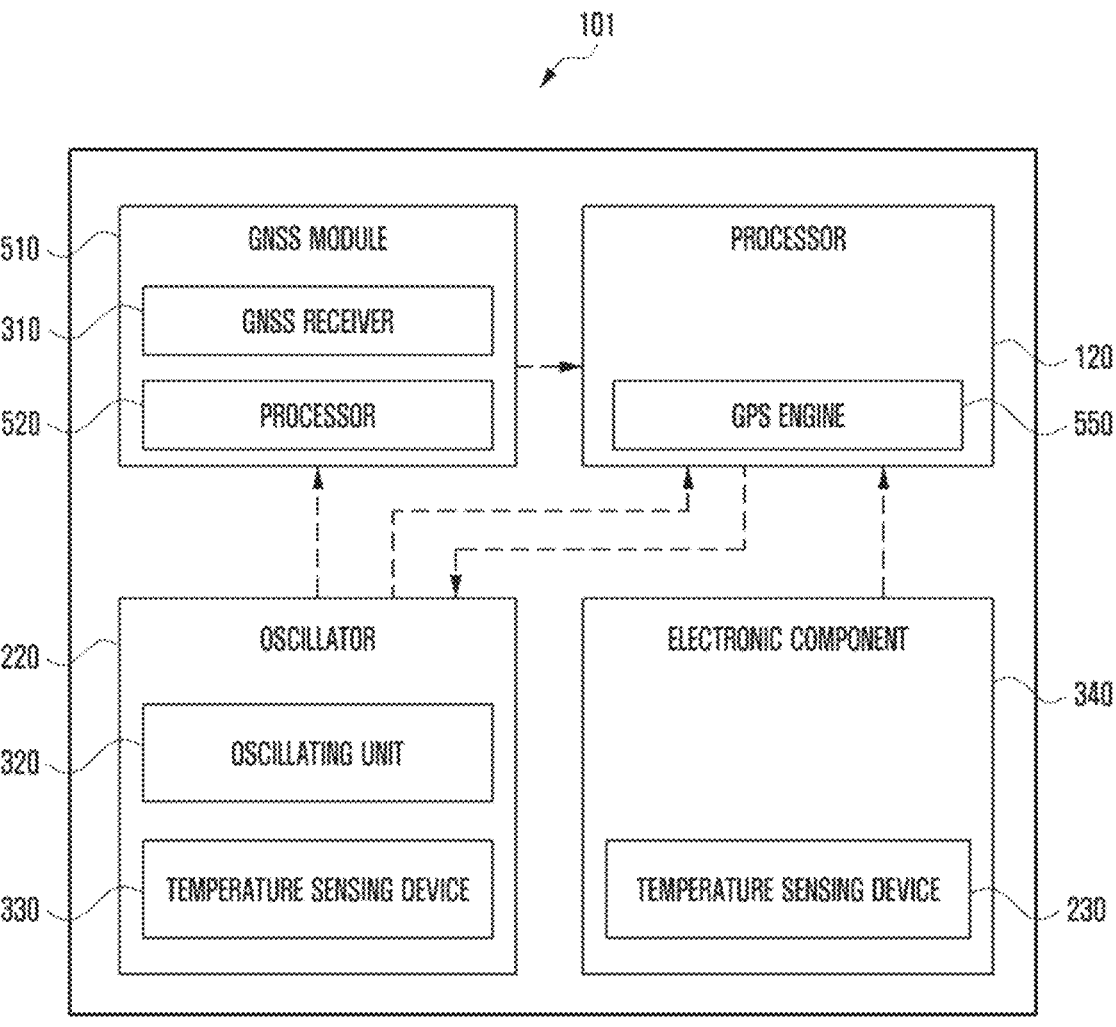
FIG. 5 is a view schematically illustrating an example of a block configuration for improving communication performance in an electronic device according to an embodiment.

FIG. 5 is a view schematically illustrating an example of a block configuration for improving communication performance in an electronic device according to an embodiment.

According to an embodiment, FIG. 5 may show an example of a design in which a GNSS communication block 219 is implemented as a GNSS module 510 including a GNSS receiver 310 and a processor 520 capable of calculating, and the processor 120 is configured in a single chip together with a GPS engine 550. For example, FIG. 5 may show an exemplary design in which a processor 520 of the GNSS module 510 distinguished from the processor 120 processes a calculation related to improving GNSS performance.

According to an embodiment, the components shown in FIG. 5 may correspond to the components described in the description with reference to FIGS. 2 and 4, with the difference that the GNSS module 510 having the GNSS receiver 310 and the processor 520 configured in a single chip is included, and other components and operations thereof may correspond to the components and the operations thereof in FIGS. 2 and 4.

In an embodiment, the temperature sensing device 330 of the oscillator 220 may sense an internal temperature of the oscillator 220 and transmit a sensing result (e.g., temperature information of the oscillator 220) to the processor 520 of the GNSS module 510.

According to an embodiment, the temperature sensing device 230 of the electronic component 340 may sense an internal temperature of the electronic component 340 and transmit a sensing result (e.g., temperature information of the electronic component 340) to the processor 520 of the GNSS module 510.

According to an embodiment, the GNSS module 510 may include the processor 520 which may acquire temperature information from the oscillator 220 and the temperature sensing device 230 of the electronic component 340 (e.g., including the processor 120), generate a control signal for controlling clock generation of the oscillator 220 based on the acquired temperature information, and perform a calculation therefor.

According to an embodiment, in the case of the design in FIG. 5, the collection of data (e.g., temperature information) from the temperature sensing device 230 may be performed, according to a hardware condition of the electronic device 101, by selectively connecting the temperature sensing device 230 to the processor 520 (e.g., an MPU as a first processor) of the GNSS module 510 or the processor 120 (e.g., an AP or CPU as a second processor) of the electronic device 101, or to both the first processor 520 and the second processor 120.

Figure 6:
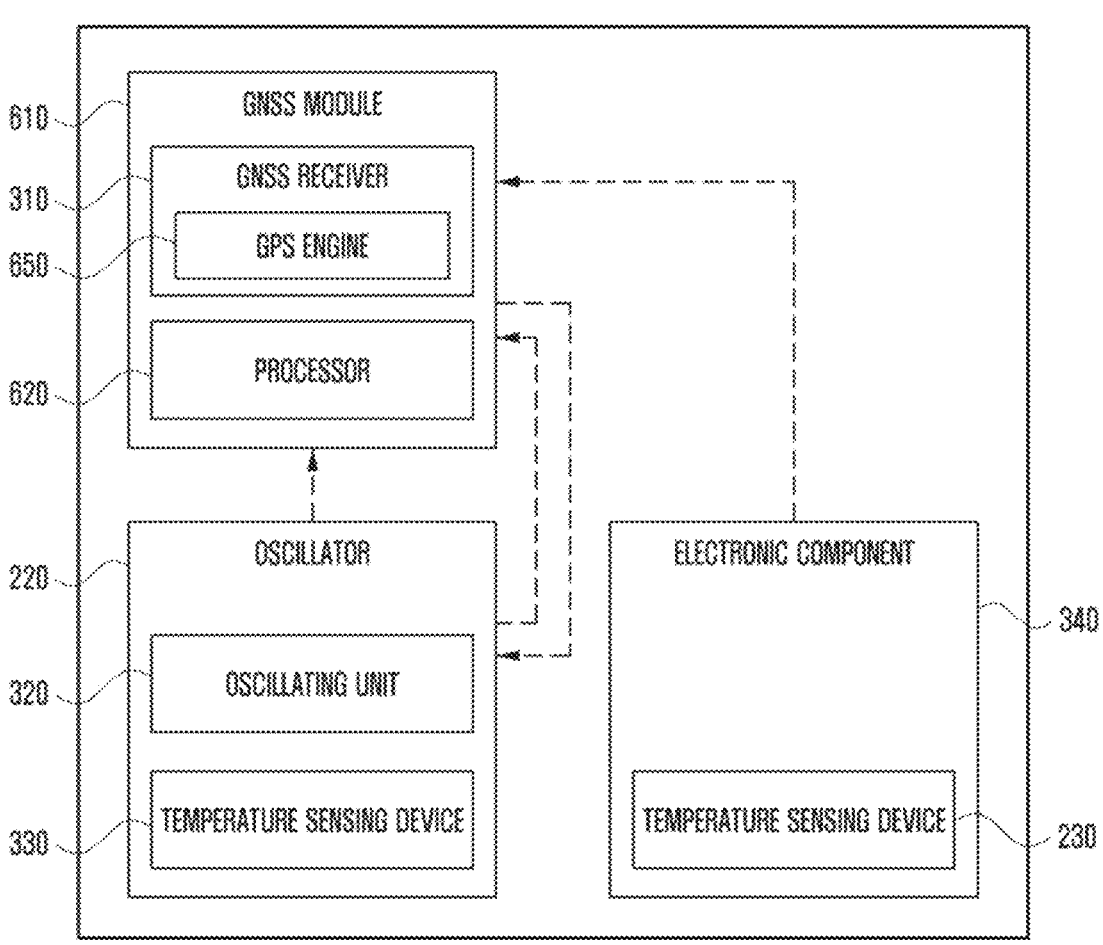
FIG. 6 is a view schematically illustrating an example of a block configuration for improving communication performance in an electronic device according to an embodiment.

FIG. 6 is a view schematically illustrating an example of a block configuration for improving communication performance in an electronic device according to an embodiment.

According to an embodiment, FIG. 6 may show an exemplary design of the GNSS module 510 in which a GNSS communication block 219 is configured in a single chip together with a GNSS receiver 310, a GPS engine 650, and a processor 620. For example, FIG. 6 may show an exemplary design in which the processor 620 of the GNSS module 610 processes a calculation related to improving GNSS performance.

According to an embodiment, the components shown in FIG. 6 may correspond to the components described in the description with reference to FIGS. 2 and 5, and separately from the processor 120 of the electronic device 101, the processor 620 of the GNSS module 610 may independently process a calculation related to improving GNSS performance.

According to an embodiment, in the case of the design shown in FIG. 6, by connecting the temperature sensing device 230 and the GNSS module 610 (e.g., the processor 620), the GNSS module 610 (e.g., the processor 620) may collect temperature information from the temperature sensing device 230. For example, the temperature sensing device 330 of the oscillator 220 may transfer temperature information of the oscillator 220 to the processor 620 of the GNSS module 610, and the temperature sensing device 230 of the electronic component 340 may transfer temperature information of the electronic component 340 to the processor 620 of the GNSS module 610. According to an embodiment, the processor 620 of the GNSS module 610 may generate a control signal for controlling clock generation of the oscillator 220 based on the collected temperature information and perform a calculation therefor.

Figure 7:
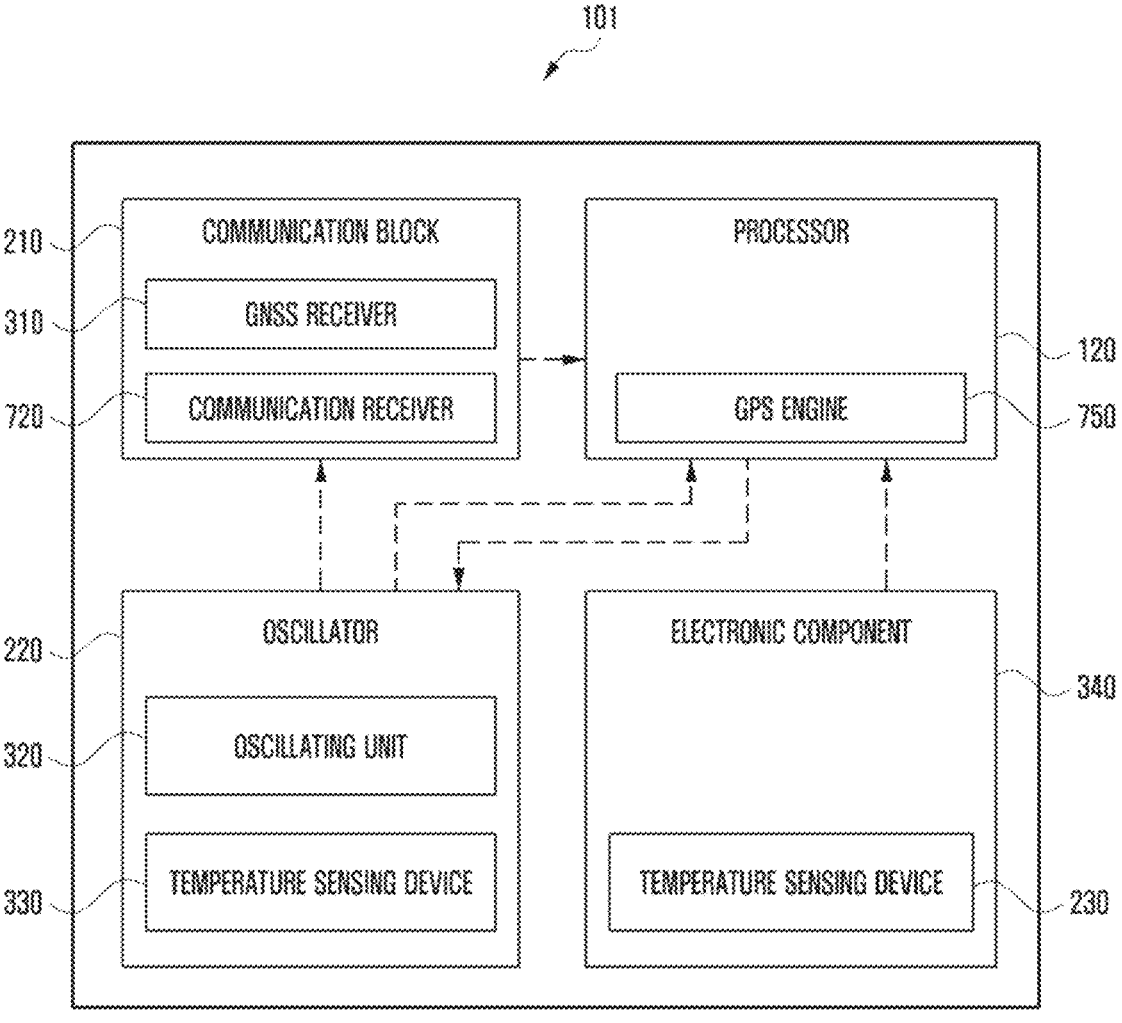
FIG. 7 is a view schematically illustrating an example of a block configuration for improving communication performance in an electronic device according to an embodiment.

FIG. 7 is a view schematically illustrating an example of a block configuration for improving communication performance in an electronic device according to an embodiment.

According to an embodiment, FIG. 7 may show an exemplary design in which at least two or more components (e.g., a mobile communication block 211, a Wi-Fi communication block 213, a Bluetooth communication block 215, an NFC communication block 217, and/or a GNSS communication block 219)) of the communication block 210 classified as connectivity are configured in a single chip as shown in FIG. 2, and the processor 120 is configured in a single chip together with an engine related to signal processing of another communication block including the GPS engine 750. For example, FIG. 7 may show an exemplary design in which the processor 120 processes a calculation related to improving communication performance related to a corresponding component of the communication block 210.

According to an embodiment, the components shown in FIG. 7 may correspond to the components described in the description with reference to FIGS. 2 and 6, and there may be difference in that the processor 120 of the electronic device 101 independently processes a calculation related to improving corresponding communication performance for each component (e.g., the GNSS receiver 310 and the communication receiver 720) of the communication block 210. In an embodiment, for example, the communication receiver 720 may represent a receiver that corresponds to the various communication blocks shown in communication block 210 of FIG. 2.

According to an embodiment, in the case of the design shown in FIG. 7, the temperature sensing device 230 and the processor 120 may be connected, the processor 120 may collect temperature information from the temperature sensing device 230, generate, based on the collected temperature information, each control signal for controlling the clock generation of the oscillator 220 corresponding to each communication block in the communication block 210, and independently perform a calculation therefor for each communication block.

According to various embodiments, the electronic device 101 may be configured to improve communication performance of the electronic device 101 in response to the internal temperature of the electronic device 101 through various designs as described in the description with reference to FIGS. 2 to 7.

According to an embodiment, a general electronic device may perform a clock generation operation of the oscillator 220 based on temperature information of a designated electronic component (e.g., the oscillator 220 or the processor 120). According to the electronic device 101 according to an embodiment, the electronic device 101 may initially collect temperature information of the electronic component 340 from the corresponding temperature sensing device 230 of the electronic component 340 around the oscillator 220 and monitor a temperature change while performing a clock generation operation of the oscillator 220 based on temperature information of a designated electronic component.

The electronic device 101 according to an embodiment may predict a temperature change based on temperature information related to the electronic component 340, determine, according to the predicted temperature change, an electronic component 340 to be referred to for clock generation of the oscillator 220, and cause a clock to be generated, which matches to a frequency characteristic at the temperature of the determined electronic component 340.

According to an embodiment, the operation may be performed to cause the clock of the oscillator 220 to be generated using an average value of at least two temperature sensing devices. For example, the electronic device 101 may use the average temperature of at least two electronic components as data to be referred to for the clock of the oscillator 220.

According to an embodiment, in case that the first temperature sensing device of the first electronic component (e.g., a PAM) and the second temperature sensing device of the second electronic component (e.g., a PMIC) show peaks with the same temperature change trend, the electronic device 101 may cause a clock of the oscillator 220 to be generated by using an average value of two values of first temperature data of the first temperature sensing device and second temperature data of the second temperature sensing device. For example, the clock of the oscillator 220 may be generated to serve as an averaging filter for a section where a current change is relatively large and a temperature change is relatively large.

According to an embodiment, the electronic device 101 may change the peripheral temperature sensing device (e.g., the reference electronic component) for reference in real time. According to an embodiment, the electronic device 101 may calculate a difference (e.g., Max−Min) between a maximum value (Max) and a minimum value (Min) of samples generated during a predetermined period (e.g., about 3 seconds or about 5 seconds) for all peripheral temperature sensing devices by shifting one sample at a time. According to an embodiment, based on a calculation result, the electronic device 101 may determines a time point at which a weight priority changes as a time point at which another type of event occurs, and change a temperature sensing device with a highest weight as the reference temperature sensing device.

An electronic device 101 according to an embodiment may include a communication circuit (e.g., the communication block 210 in FIG. 2), an oscillator (e.g., the oscillator 220 in FIG. 2) configured to generate a clock related to the communication circuit, a plurality of electronic components (e.g., the electronic component 340 in FIGS. 3 to 7) arranged around the oscillator, a plurality of temperature sensing devices (e.g., the temperature sensing device 230 in FIGS. 2 to 7) respectively corresponding to the plurality of electronic components, and a processor (e.g., the processor 120, 520, or 620 in FIGS. 1 to 7) operatively connected to the communication circuit, the oscillator, the electronic components, and the temperature sensing devices. According to an embodiment, the processor 120, 520, or 620 may collect temperature data related to the plurality of electronic components from the plurality of temperature sensing devices. According to an embodiment, the processor 120, 520, or 620 may predict a temperature change with respect to the plurality of electronic components based on the collected temperature data. According to an embodiment, the processor 120, 520, or 620 may determine a reference electronic component to be referred to for clock generation of the oscillator based on the predicted temperature change. According to an embodiment, the processor 120, 520, or 620 may control clock generation of the oscillator based on temperature data of the determined reference electronic component.

According to an embodiment, the processor 120, 520, or 620 may operate to collect the temperature data from the plurality of temperature sensing devices for each designated sample.

According to an embodiment, the processor 120, 520, or 620 may operate to determine a temperature change trend for each electronic component based on the temperature data related to each of the plurality of electronic components and predict a future temperature change for each electronic component, based on the temperature change trend for each electronic component.

According to an embodiment, the processor 120, 520, or 620 may operate to determine an electronic component having a greatest temperature change range as the reference electronic component, based on the predicted temperature change for each of the plurality of electronic components.

According to an embodiment, the processor 120, 520, or 620 may operate to provide temperature data related to the determined reference electronic component to the oscillator (e.g., share with the oscillator) so that the oscillator generates a clock based on the temperature data of the determined reference electronic component.

According to an embodiment, the oscillator may operate to predict a future temperature change based on the temperature data provided from the processor 120, 520, or 620, and generate a clock based on the predicted temperature change.

According to an embodiment, the processor 120, 520, or 620 may operate to control an operation of the oscillator based on first temperature data of a first electronic component having been determined as the reference electronic component, change the reference electronic component based on temperature data corresponding to each of the plurality of electronic components, and control an operation of the oscillator based on second temperature data of a second electronic component having been changed to the reference electronic component.

According to an embodiment, the processor 120, 520, or 620 may operate to calculate a weight for each of the plurality of electronic components, determine a weight priority, and determine the second electronic component corresponding to a highest priority weight as a reference electronic component.

According to an embodiment, the weight may be proportional to the difference between the maximum value and the minimum value in temperature data and may be inversely proportional to a distance between the electronic component and the oscillator.

According to an embodiment, the processor 120, 520, or 620 may identify the maximum value and the minimum value while shifting samples generated for a predetermined time period by one sample at a time with respect to a temperature sensing device corresponding to each of the plurality of electronic components. According to an embodiment, the processor 120, 520, or 620 may calculate the difference value based on a difference between the maximum value and the minimum value. According to an embodiment, the processor 120, 520, or 620 may calculate a weight for each electronic component based on the difference value and the distance between the electronic component and the oscillator. According to an embodiment, the processor 120, 520, or 620 may determine a highest weight among calculated weights for electronic components as the highest priority weight.

According to an embodiment, the processor 120, 520, or 620 may operate to determine whether an event related to the change of the reference electronic component has occurred, based on the predicted temperature change.

According to an embodiment, the event may include an event regarding whether there is a temperature change that precedes a future temperature change of the oscillator among the temperature changes of the plurality of electronic components.

According to an embodiment, in case that there is a temperature change that precedes a future temperature change of the oscillator among the temperature changes of the plurality of electronic components, the processor 120, 520, or 620 may operate to determine a change of the reference electronic component.

Hereinafter, an operation method of an electronic device 101 according to various embodiments will be described in detail. Operations performed by the electronic device 101 according to various embodiments may be executed by a processor (e.g., 120, 520, or 620) including various processing circuit (circuitry) and/or executable program elements of the electronic device 101. For example, at least one processor (e.g., 120, 520, and/or 620) may be used depending on the design structure of the electronic device 101 as described in the description with reference to FIGS. 3 to 7. Hereinafter, for convenience of explanation, an example of operation based on the processor 120 will be described. According to an embodiment, the operations performed in the electronic device 101 may be executed by instructions stored in a memory 130 and when executed, configured to operate the processor 120.

Figure 8:
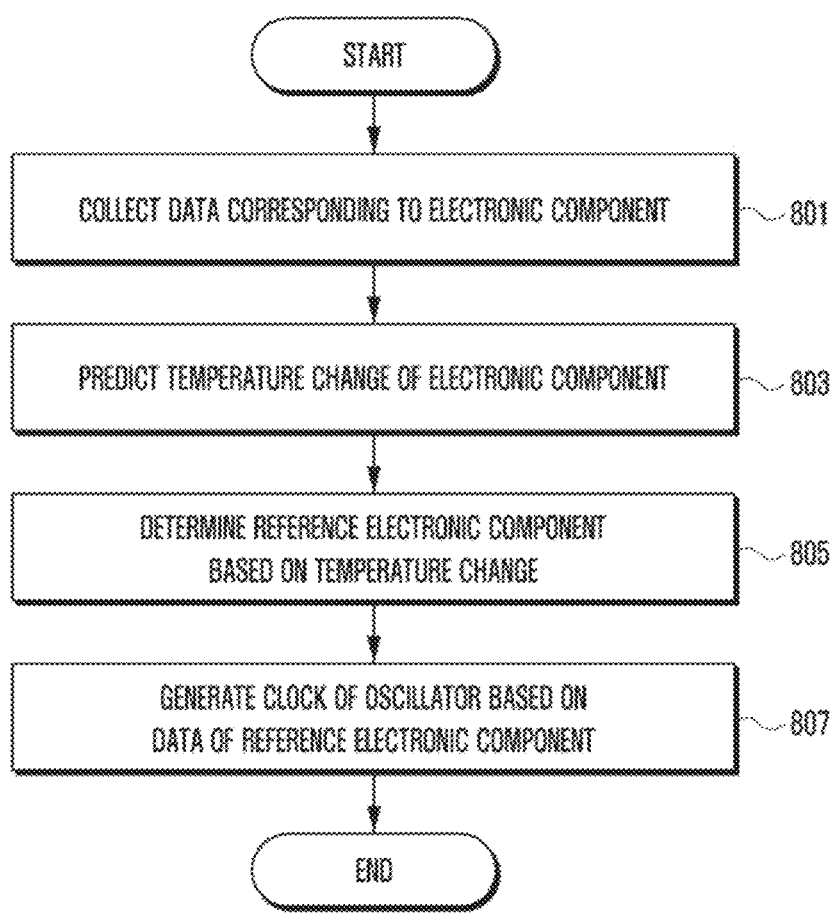
FIG. 8 is a flowchart illustrating an operating method of an electronic device according to an embodiment.

FIG. 8 is a flowchart illustrating an operating method of an electronic device according to an embodiment.

In an embodiment, a method for improving communication performance (e.g., GNSS performance) of the electronic device 101 in response to an internal temperature (e.g., a temperature corresponding to each electronic component) of the electronic device 101 may be performed, for example, according to the flowchart shown in FIG. 8. The flowchart shown in FIG. 8 is merely a flowchart according to an embodiment of the method for improving communication performance of the electronic device 101, and at least some operations may be changed in the order thereof, performed simultaneously, performed as independent operations, or at least some of the operations may be performed complementary to at least some other operations. According to an embodiment, operations 801 to 807 may be performed by at least one processor (e.g., 120, 520, and/or 620) of the electronic device 101.

As shown in FIG. 8, the method for improving communication performance (e.g., GNSS performance) of the electronic device 101 according to an embodiment may include an operation of collecting data (e.g., temperature data or temperature information) corresponding to the electronic component 340 (operation 801), an operation of predicting a temperature change in the electronic component 340 based on the collected data (operation 803), an operation of determining a reference electronic component to be referred to for clock generation of the oscillator 220 based on the predicted temperature change (operation 805), and an operation of controlling the oscillator 220 to generate a clock based on data (e.g., temperature information) of the determined reference electronic component (operation 807).

Referring to FIG. 8, in operation 801, the processor 120 of the electronic device 101 may collect data (e.g., temperature information) corresponding to the electronic component 340. According to an embodiment, the processor 120 may collect temperature information related to an electronic component 340 from a temperature sensing device 230 corresponding to each electronic component 340 around the oscillator 220. According to an embodiment, the temperature information may be collected for each designated sample.

In operation 803, the processor 120 may predict a temperature change of the electronic component 340 based on the collected data. According to an embodiment, the processor 120 may predict a temperature change with respect to the electronic component 340 based on temperature information related to each of the peripheral electronic components 340. According to an embodiment, the processor 120 may determine a temperature change trend for each electronic component 340 based on temperature information related to each of the peripheral electronic components 340. According to an embodiment, the processor 120 may predict a future temperature change for each electronic component 340 based on the temperature change trend for each electronic component 340.

In operation 805, the processor 120 may determine a reference electronic component to be referred to for clock occurrence (or oscillation or generation) of the oscillator 220 respectively corresponding to the communication block 210 based on the predicted temperature change. According to an embodiment, the processor 120 may determine an electronic component having the highest temperature change range (e.g., temperature difference value) as the reference electronic component, based on the temperature change predicted for each peripheral electronic component 340.

In operation 807, the processor 120 may perform an operation to control clock generation of the oscillator 220 based on data (e.g., temperature information) of the determined reference electronic component. According to an embodiment, the processor 120 may provide (e.g., share) the temperature information of the determined reference electronic component to the oscillator 220 as temperature information to be referred to by the oscillator 220. According to an embodiment, the oscillator 220 may operate to predict a future temperature change based on the temperature information, and generate a clock based on the predicted temperature change.

Hereinafter, a detailed description about embodiments of each operation illustrated in FIG. 8 will be given.

Figure 9:
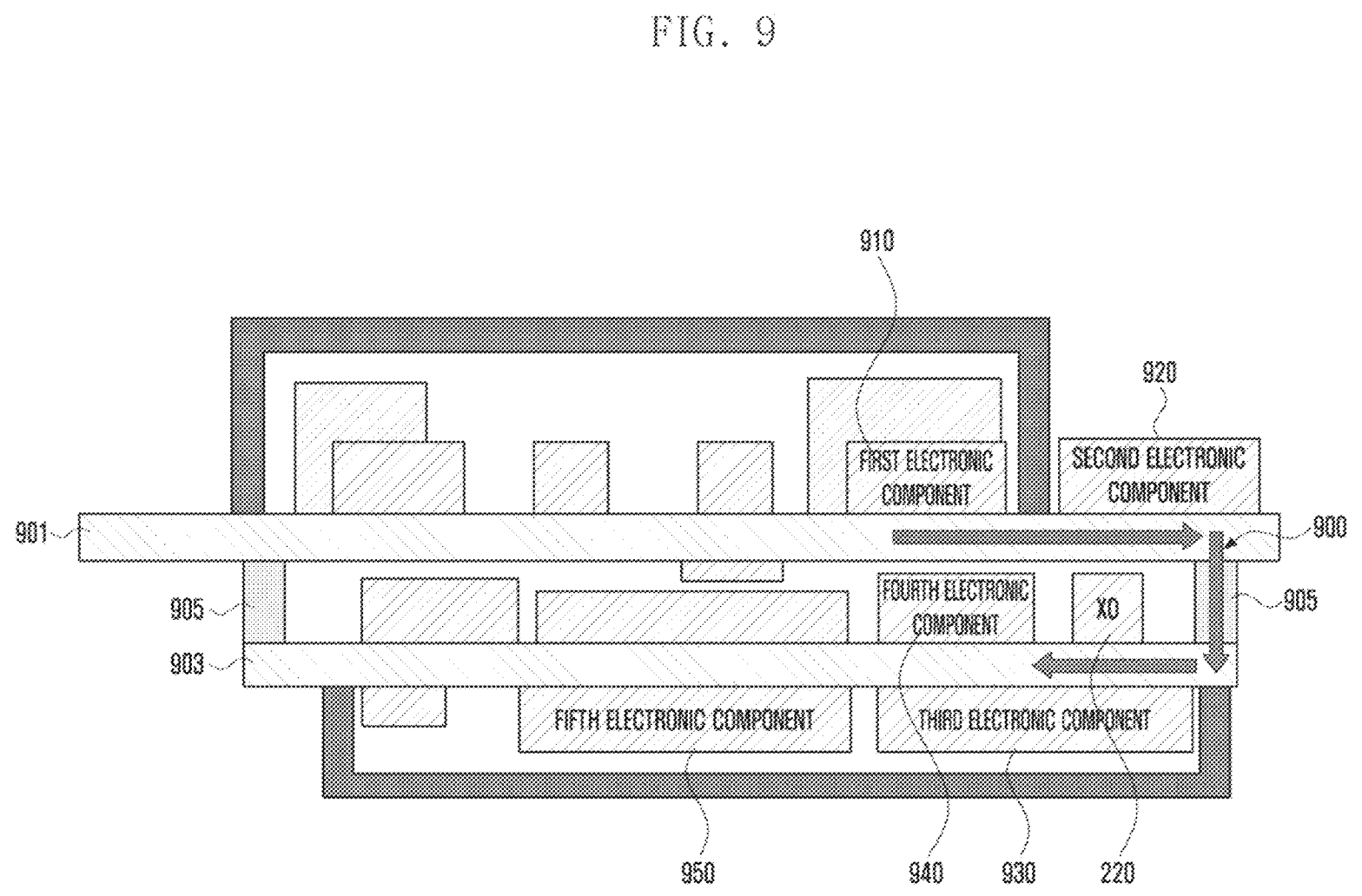

FIG. 9 is a view illustrating an example of arrangement of an oscillator and an electronic component in an electronic device according to an embodiment.

According to an embodiment, in FIG. 9, the electronic device may include a first circuit board 901 (e.g., a main PCB), and a second circuit board 903 (e.g., a sub-PCB). According to an embodiment, FIG. 9 may show an example in which the first circuit board 901 and the second circuit board 903 are stacked in a stack-up structure. According to an embodiment, in FIG. 9, the electronic device may include an interposer 905 that defines an electrical path between the first circuit board 901 and the second circuit board 903. According to an embodiment, various electronic components may be arranged in the electronic device 101 through the first circuit board 901 and the second circuit board 903.

FIG. 9 may show an example that a path 900 through which heat is transmitted in the electronic device 101 passes by a first electronic component 910, a second electronic component 920, a third electronic component 930, a fourth electronic component 940, and the fifth electronic component 950.

In the case of the oscillator 220 for GNSS, the electronic device 101 operates by referring only to temperature data from a designated temperature sensing device (e.g., the temperature sensing device of the first electronic component 910). For example, the oscillator 220 may operate to compensate in advance for the clock of the oscillator 220 by considering a temperature change trend of a designated temperature sensing device and predicting a future temperature change. In this case, the designated temperature sensing device referred to by the oscillator 220 is required to have a change in temperature before a change of temperature of the oscillator 220. For example, proper operation may be achieved only when the temperature of the oscillator 220 changes after the temperature of the designated temperature sensing device.

However, in the electronic device 101, there may be a case where the temperature of the oscillator 220 changes ahead of the temperature sensing device to which the oscillator 220 refers. For example, as shown in FIG. 9, a temperature inversion phenomenon may occur in case that the oscillator 220 is located (or disposed) closer to a main heat-generating electronic component (e.g., the fourth electronic component 940) than to the electronic component (e.g., the first electronic component 910) of the referred designated temperature sensing device. In this case, a bit error rate (BER) failure and/or cycle slip may occur in the electronic device 101.

In an embodiment, the cycle slip may indicate a phenomenon in which a clock drift or bit error occurs and the electronic device 101 loses the satellite. As such, in case that a satellite is lost, the electronic device 101 may calculate an incorrect location and/or the time to first fix (TTFF) (e.g., actual time taken to determine the location with a GNSS receiver) may become long. For example, the temperature inversion phenomenon may cause GNSS failure, and therefore, the temperature change of the oscillator 220 should always lag the temperature change in the reference temperature sensing device.

In various embodiments, the most suitable ambient temperature data may be dynamically referred to in various heat generation environments of the electronic device 101 supporting various high-spec functions. According to an embodiment, the electronic device 101 may improve GNSS performance by predicting a temperature change of the oscillator 220 in advance based on ambient temperature data and preventing a temperature inversion phenomenon of the oscillator 220.

The electronic device 101 according to an embodiment may collect data (e.g., temperature information) corresponding to various electronic components, and determine a reference electronic component to be referred to for clock generation of the oscillator 220 based on the collected data. According to an embodiment, in a method for determining a reference electronic component, the electronic device 101 may determine the reference electronic component among various electronic components (e.g., heat generation sources) around the oscillator 220, based on a distance to the oscillator 220 and/or a heat generation degree (e.g., variation in heat generation) of the electronic components.

According to an embodiment, the electronic device 101 may determine an electronic component disposed at the closest distance (e.g., the relatively closest (or shortest) distance) among various electronic components around the oscillator 220 as a candidate for the reference electronic component. For example, the electronic device 101 may cause clock generation of the oscillator 220 by referring to data from a temperature sensing device of an electronic component that is closest to the oscillator 220.

For example, data from the temperature sensing device of the electronic component (e.g., the fourth electronic component 940) closest to the oscillator 220 may be referred to.

According to an embodiment, depending on the design of the electronic device 101, it may be assumed that the electronic component closest to the oscillator 220 is the fourth electronic component 940 (e.g., a PMIC), and the electronic component with the highest heat generation in an operation state of the electronic device 101 is the fifth electronic component 950 (e.g., the processor 120). In this case, the fourth electronic component 940, which is closest in distance to the oscillator 220, or the fifth electronic component 950, which has greatest heat generation, may be designated as the electronic component that has the greatest influence on the temperature change of the oscillator 220.

However, rather than the temperature change trend of the fifth electronic component 950, a temperature change trend of other electronic components (e.g., the first electronic component 910 (e.g., a PAM)) may be similar to that of the oscillator 220. For example, as shown in FIG. 9, heat starts to be generated from the first electronic component 910 (e.g., a PAM), and in the path 900 through which heat is transferred, the main heat generation source may be the first electronic component 910.

According to an embodiment, in case that heat is transferred through the path 900 as shown in FIG. 9, the electronic device 101 may monitor data from a temperature sensing device of a peripheral electronic component and determine the first electronic component 910 as the reference electronic component to be referred to by the oscillator 220 based on the data acquired by monitoring. According to an embodiment, the oscillator 220 may refer to data from the temperature sensing device of the first electronic component 910. As such, rather than determining the reference electronic component based on the temperature change trend of peripheral electronic components, as in related art, when the temperature sensing device of the designated electronic component (e.g., the fourth electronic component 940 based on distance or the fifth electronic component 950 based on heat generation) is fixedly used, the temperature inversion phenomenon caused when the temperature change of the oscillator 220 precedes the temperature change of the reference electronic component occurs as described above, which may cause GNSS failure. For example, the temperature change of the oscillator 220 may lag behind the temperature change of the referenced electronic component.

According to an embodiment, the electronic device 101 may determine an electronic component having a greatest change range in heat generation among various electronic components around the oscillator 220 as a candidate for the reference electronic component. For example, the electronic device 101 may cause clock generation of the oscillator 220 by referring to data from a temperature sensing device of an electronic component having a greatest change range in heat generation.

For example, assuming that in the example of FIG. 9, the fifth electronic component 950 (e.g., the processor 120) instantaneously has a first temperature change (e.g., about 1.5° C.), and the fourth electronic component 940 (e.g., a PMIC) has a second temperature change (e.g., 0.4° C.) lower than the first temperature change, data of the temperature sensing device of the electronic component (e.g., the fifth electronic component 950) with the greatest change in heat generation may be referred to.

According to an embodiment, the electronic device 101 may determine the reference electronic component by considering both a distance between the oscillator 220 and an electronic component (e.g., a first condition) and a change range in heat generation of an electronic component (e.g., a second condition) with respect to various electronic components (e.g., a heat source) around the oscillator 220. For example, when determining the reference electronic component, the electronic device 101 may configure a weight to satisfy both the first condition and the second condition and determine the reference electronic component based on the weight.

According to an embodiment, as shown in FIG. 9, an example in which the oscillator 220 and about five electronic components 910, 920, 930, 940, and 950 are arranged adjacent to the oscillator 220 will be described. According to an embodiment, temperature sensing devices respectively corresponding to the five electronic components 910, 920, 930, 940, and 950 may be included (or connected). In the design environment as shown in FIG. 9, a physical distance between the oscillator 220 and each of the electronic components 910, 920, 930, 940, and 950 may be calculated in advance and stored in the memory 130 (or a ROM of the processor 120 of the electronic device 101) of the electronic device 101. In an embodiment, physical distances between the oscillator 220 and the electronic components 910, 920, 930, 940, and 950 may be calculated using, for example, a PCB tool.

In an embodiment, a case in which the distances between the oscillator 220 and the electronic components 910, 920, 930, 940, and 950 include, for example, a first distance D1 (e.g., about 8.726 mm), a second distance D2 (e.g., about 10.984 mm), a third distance D3 (e.g., about 12.733 mm), a fourth distance D4 (e.g., about 9.211 mm), and a fifth distance D5 (e.g., about 2.56 mm) as an example.

According to an embodiment, the processor 120 of the electronic device 101 may calculate a difference value (e.g., Max–Min) between a maximum value (Max) and a minimum value (Min) for each temperature information based on temperature information collected from a temperature sensing device corresponding to each of the electronic components 910, 920, 930, 940, and 950 for a designated predetermined time period (e.g., about 5 seconds). According to an embodiment, the processor 120 may calculate a difference value for each electronic component based on data (e.g., temperature information) collected from temperature sensing devices corresponding to the electronic components 910, 920, 930, 940, and 950, respectively.

According to an embodiment, the processor 120 may calculate a difference value between a maximum value and a minimum value of samples (e.g., temperature data) generated during a predetermined period (e.g., about 5 seconds) for peripheral temperature sensing devices by shifting one sample at a time. In an embodiment, a case in which the difference values calculated by processor 120 include, for example, a first difference value $\Delta T1$ (e.g., about 5° C.), a second difference value $\Delta T2$ (e.g., about 0.2° C.), a third difference value $\Delta T3$ (e.g., about 0.8° C.), a fourth difference value $\Delta T4$ (e.g., about 2.1° C.), and a fifth difference value $\Delta T5$ (e.g., about 0.2° C.)) may be used as an example.

According to an embodiment, the processor 120 may configure a higher weight when a temperature change during a unit time is relatively large and a distance is relatively short, and configure a low weight when a temperature change during a unit time is relatively small and a distance is relatively long. For example, the weight may be proportional to the difference value $\Delta T$ and inversely proportional to the distance D. Based on this, the processor 120 may calculate a first weight associated with the first electronic component 910, a second weight associated with the second electronic component 920, a third weight associated with the third electronic component 930, a fourth weight associated with the fourth electronic component 940, and a fifth weight associated with the fifth electronic component 950.

In an embodiment, a case in which the weights calculated by the processor 120 include, for example, a first weight (e.g., $\Delta T1/D1$=about 5/about 8.726=about 0.573), a second weight (e.g., $\Delta T2/D2$=about 0.2/about 10.984=about 0.018), a third weight (e.g., $\Delta T3/D3$=about 0.8/about 12.733=about 0.063), a fourth weight (e.g., $\Delta T4/D4$=about 2.1/about 9.211=about 0.228), and a fifth weight (e.g., $\Delta T5/D5$=about 0.2/about 2.56=0.078) may be used as an example.

As in the example above, the electronic component closest to the oscillator 220 may be the electronic component at a fifth distance (e.g., about 2.56 mm). According to an embodiment, in the case of weights considering a temperature change range (e.g., a temperature difference value), the first weight (e.g., about 0.573) is the highest, and therefore, the electronic component with the greatest weight may be the electronic component corresponding to the first weight.

As a result, the processor 120 of the electronic device 101 may determine the electronic component corresponding to the first weight as the reference electronic component to be referred to by the oscillator 220, and refer to data of a temperature sensing device of the determined reference electronic component to compensate for a clock of the oscillator 220.

According to an embodiment, the processor 120 of the electronic device 101 may monitor data from temperature sensing devices of various electronic components, calculate weights, and share, with the oscillator 220 in advance, temperature information that the oscillator 220 should refer to in real time. According to an embodiment, the oscillator 220 may predict a temperature change that will occur in the future, based on the temperature information, and generate a clock matching a frequency characteristic at the predicted temperature (e.g., a temperature to be generated in the future) as shown in the graph of frequency characteristics by temperature of the oscillator 220 shown in FIG. 10.

Figure 10:
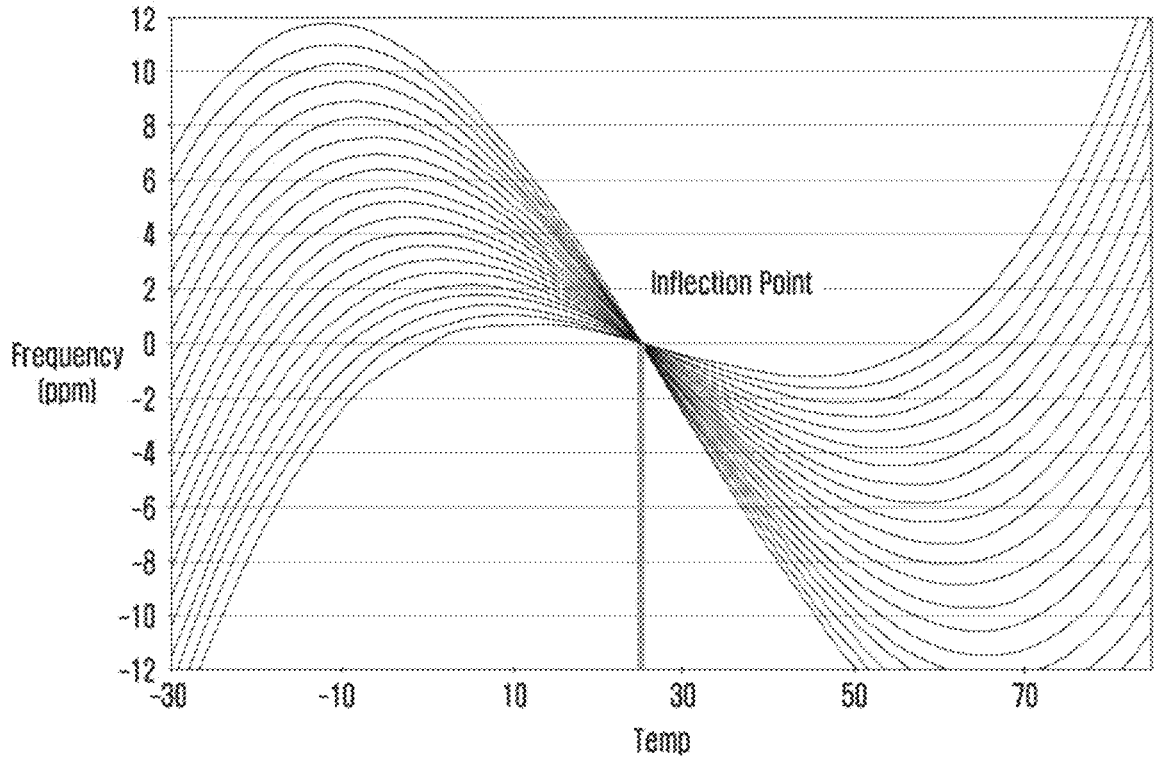
FIG. 10 is a view illustrating an example of a frequency characteristic graph by temperature of an oscillator according to an embodiment.

FIG. 10 is a view illustrating an example of a frequency characteristic graph by temperature of an oscillator according to an embodiment of the disclosure.

According to an embodiment, FIG. 10 may show an example of a graph of frequency characteristics by temperature of the oscillator 220. For example, an oscillator corresponding to each component of the communication block 210 may have a temperature characteristic as illustrated in FIG. 10. According to an embodiment, the oscillator 220 may sense a temperature through a temperature sensing device within the oscillator 220 and generate a clock by reflecting a frequency drift amount corresponding to the sensed temperature data to the clock.

According to an embodiment, the processor 120 may process a calibration operation before operating the oscillator 220 so that the oscillator 220, which has frequency characteristics by temperature as illustrated in FIG. 10, may always generate the same clock. According to an embodiment, the processor 120 may process a clock calibration operation by using a designated function pre-stored in the memory 130 (or an internal memory (e.g., a ROM) of the processor 120) before operating the oscillator 220. For example, the clock calibration operation may utilize a designated polynomial (e.g., a cubic polynomial).

According to an embodiment, the processor 120 may receive (or acquire) temperature data of the oscillator 220 for each designated sample after the calibration of the oscillator 220. According to an embodiment, after the clock calibration, the oscillator 220 may transmit temperature data (or temperature information) to the processor 120 for each sample designated by the temperature sensing device of the oscillator 220.

According to an embodiment, when temperature data is acquired from the oscillator 220, the processor 120 may perform a weight calculation with respect to a temperature sensing device of a peripheral electronic component 340 corresponding to the same time stamp. According to an embodiment, the processor 120 may select an electronic component having the highest weight among the peripheral electronic components 340 based on the weight calculation. For example, the processor 120 may determine a reference electronic component for temperature information to be referred to for the clock generation operation of the oscillator 220.

According to an embodiment, the processor 120 may select the highest weight by calculating a difference between a maximum value and a minimum value of temperature data while shifting one sample at a time for a predetermined time period (e.g., about 5 seconds). According to an embodiment, the processor 120 may determine the reference electronic component based on the selected weight. According to an embodiment, the processor 120 may compare a data slope (e.g., a first slope) based on the temperature data collected from the temperature sensing device of the oscillator 220 and a data slop (e.g., a second slop) based on the temperature data collected from the temperature sensing device of the reference electronic component. For example, the processor 120 may determine whether the first slope and the second slope are the same based on comparison of the first slope and the second slope.

According to an embodiment, in case that the first slope and the second slope are the same, the processor 120 may determine that the same temperature change trend will occur between the oscillator 220 and the reference electronic component. According to an embodiment, the processor 120 may share the temperature date with the oscillator 220 so that the oscillator 220 refers to the temperature data of the temperature sensing device of the reference electronic component, based on the result of determining that the same temperature change trend will occur.

According to an embodiment, in case that the first slope and the second slope are opposite (or not equal), the processor 120 may select a next highest weight among the calculated weights. According to an embodiment, the processor 120 may determine (e.g., change) the reference electronic component based on the selected next highest weight.

According to an embodiment, the processor 120 may compare the data slope (e.g., the first slope) based on the temperature data collected from the temperature sensing device of the oscillator 220 and a data slop (e.g., a third slop) based on temperature data collected from a temperature sensing device of the changed reference electronic component. For example, the processor 120 may determine whether the first slope and the third slope are the same based on comparison of the first slope and the third slope. According to an embodiment, in case that the first slope and the third slope are the same, the processor 120 may cause the oscillator 220 to refer to the temperature data. According to an embodiment, in case that the first slope and the third slope are not the same, the processor 120 may perform an operation to determine (e.g., change) the reference electronic component.

According to an embodiment, the temperature change of the oscillator 220 may not be greater than the temperature change of the reference electronic component (e.g., the electronic component of the temperature sensing device having the highest weight) to which the oscillator 220 refers.

According to an embodiment, in case that the temperature of the reference electronic component is continuously rising or falling, the processor 120 may use the temperature data of the reference electronic component to calculate the temperature of the oscillator 220.

According to an embodiment, in case that an inflection point occurs in the temperature change of the reference electronic component (e.g., the temperature rises and then falls, the temperature falls and then rises, or a sudden peak occurs), the processor 120 may determine whether the temperature data of the reference electronic component changes before the temperature data of the oscillator 220 changes.

According to an embodiment, in case that the same inflection point occurs even in the temperature change based on the temperature data of the temperature sensing device of the oscillator 220 within a predetermined number of samples, the processor 120 may continue to use the temperature data of the reference electronic component. According to an embodiment, in case that an inflection point does not occur in the temperature change based on the temperature data of the temperature sensing device of the oscillator 220, the processor 120 may re-execute the weight calculation in real time.

According to an embodiment, when the temperature data to be referred to is shared (e.g., received) from the processor 120, the oscillator 220 may generate a clock based on the temperature data. According to an embodiment, the oscillator 220 may tune the clock by optimizing a value of a circuit (e.g., resistor R and/or capacitor C) of the oscillating unit 320 according to an environment of the electronic device 101.

Figure 11:
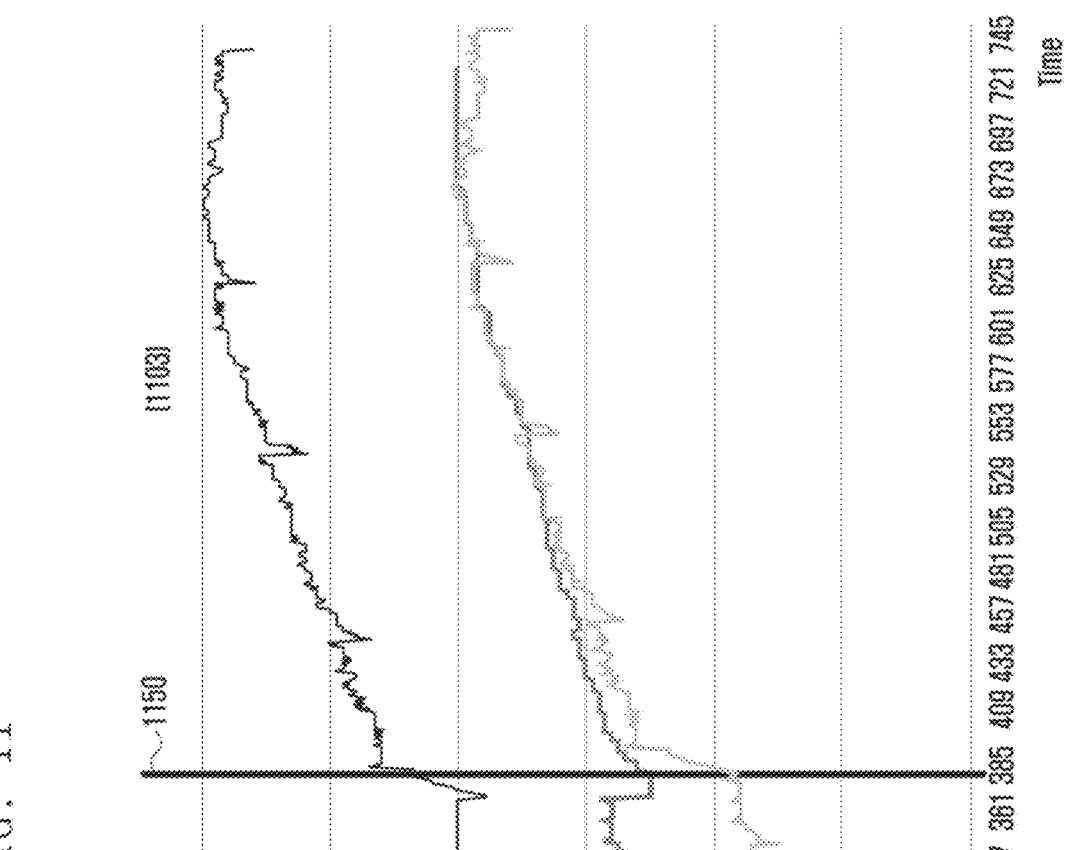
FIG. 11 is a view illustrating an example of changing a reference electronic component in an electronic device according to an embodiment.

FIG. 11 is a view illustrating an example graphs of changing a reference electronic component in an electronic device according to an embodiment.

According to an embodiment, in FIG. 11, element 1101 may represent a first section before an event occurs, and element 1103 may represent a second section after an event occurs. According to an embodiment, graph 1110 may represent an example of a graph according to a temperature change of the oscillator 220, graph 1120 may represent an example of a graph according to a temperature change of a first electronic component (e.g., the processor 120), and graph 1130 may represent an example of a graph according to temperature change of a second electronic component (e.g., a PMA).

According to an embodiment, the electronic device 101 may initially operate the oscillator 220 based on a temperature change 1120 according to temperature data of a designated first electronic component (e.g., processor 120). For example, it may be seen that during the first section 1101, a sample of the temperature change of the first electronic component as shown in graph 1120 precedes the temperature change of the oscillator 220 as shown in graph 1110. For example, the sample of the first electronic component temperature change as shown in graph 1120 may precede the temperature change of the oscillator 220 as shown in graph 1110 as in the first section 1101. Accordingly, the electronic device 101 may cause the oscillator 220 to operate by referring to the temperature change of the first electronic component during the first section 1101.

According to an embodiment, the temperature change of the second electronic component (e.g., a PAM) as shown in graph 1130 may become greater than the temperature change of the first electronic component as shown in graph 1120 over time (e.g., when an event changes). For example, a range of the temperature change of the second electronic component as shown in graph 1130 may greatly increase as at an event occurrence time point 1150. In this case, the weights for the first electronic component and the second electronic component may be changed, and the reference electronic component to be referred to by the oscillator 220 may be changed from the first electronic component to the second electronic component. For example, the sample of the second electronic component as shown in graph 1120 may precede the temperature change of the oscillator 220 as shown in graph 1110 as the example in the second section 1103. Accordingly, the electronic device 101 may cause the oscillator 220 to operate by referring to the temperature change of the second electronic component as shown in graph 1130 from the time point (e.g., the time point 1150 at which the event occurs) of the second section 1103.

According to an embodiment, the electronic device 101 may change, to the temperature data to be referred to by the oscillator 220, the temperature change 1130 of the second electronic component having been changed to the reference electronic component during the second section 1103 from the time point 1150 at which the event for changing the reference electronic component. For example, the electronic device 101 may change the peripheral temperature sensing device that the oscillator 220 will refer to in real time (e.g., change the reference electronic component).

According to an embodiment, the electronic device 101 may calculate a difference between a maximum value and a minimum value in real time while shifting the samples, which have been generated by the peripheral temperature sensing device for a predetermined time period (e.g., 5 seconds), by one sample at a time. According to an embodiment, based on a calculation result, the processor 120 may determine a time point at which a weight priority changes as a time point 1150 at which the event for changing the reference electronic component occurs. According to an embodiment, the electronic device 101 may change an electronic component having a highest weight to a new reference electronic component according to a result of calculating a weight for a peripheral temperature sensing device to be referred to.

Figure 12:
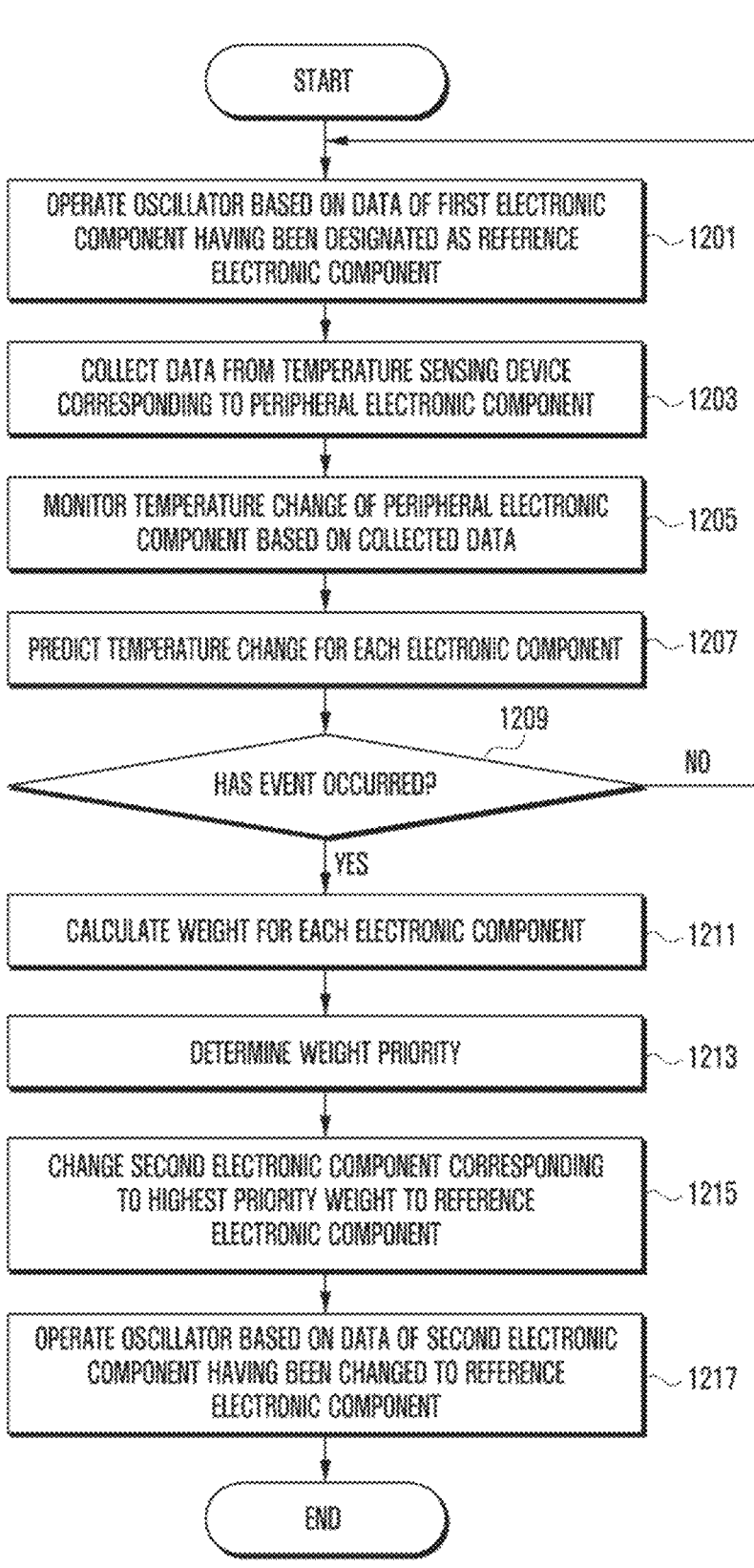
FIG. 12 is a flowchart illustrating an operating method of an electronic device according to an embodiment.

FIG. 12 is a flowchart illustrating an operating method of an electronic device according to an embodiment of the disclosure.

In an embodiment, a method for improving communication performance (e.g., GNSS performance) of the electronic device 101 in response to an internal temperature (e.g., a temperature corresponding to each electronic component) of the electronic device 101 may be performed, for example, according to the flowchart shown in FIG. 12. The flowchart shown in FIG. 12 is merely a flowchart according to an embodiment of the method for improving communication performance of the electronic device 101, and at least some operations may be changed in the order thereof, performed simultaneously, performed as independent operations, or at least some of the operations may be performed complementary to at least some other operations. According to an embodiment, operations 1201 to 1217 may be performed by at least one processor (e.g., 120, 520, and/or 620) of the electronic device 101.

As shown in FIG. 12, the method for improving communication performance (e.g., GNSS performance) of the electronic device 101 according to an embodiment may include an operation of controlling an operation of the oscillator 220 based on data (e.g., first temperature data or first temperature information) of a first electronic component having been designated as a reference electronic component (operation 1201), an operation of collecting data from a temperature sensing device corresponding to each peripheral electronic component 340 (operation 1203), an operation of monitoring a temperature change of the peripheral electronic component 340 based on the collected data (operation 1205), an operation of predicting a temperature change for each electronic component 340 (operation 1207), an operation of determining whether an event occurs (operation 1209), an operation of calculating a weight for each electronic component 340 based on event occurrence (operation 1211), an operation of determining a weight priority (operation 1213), an operation of changing a second electronic component corresponding to a highest priority weight to a reference electronic component (operation 1215), and an operation of controlling an operation of the oscillator 220 based on data (e.g., second temperature data or second temperature information) of the second electronic component having been changed to the reference electronic component (operation 1217).

Referring to FIG. 12, in operation 1201, the processor 120 of the electronic device 101 may control an operation of the oscillator 220 based on data of the first electronic component having been designated as the reference electronic component. According to an embodiment, the processor 120 may share temperature data of the first electronic component with the oscillator 220 so that the oscillator 220 may generate a clock based on the data of the first electronic component. According to an embodiment, the processor 120 may provide (e.g., share) the temperature information of the determined reference electronic component as temperature information to be referred to by the oscillator 220.

According to an embodiment, the oscillator 220 may operate to predict a future temperature change based on the temperature information, and generate a clock based on the predicted temperature change. In an embodiment, the designated reference electronic component may include an electronic component determined according to a distance and/or a heat generation change range or an electronic component preconfigured as the reference electronic component during an initial operation.

In operation 1203, the processor 120 may collect data from a temperature sensing device corresponding to the peripheral electronic component 340. According to an embodiment, the processor 120 may collect temperature information related to a corresponding electronic component 340 from a temperature sensing device 230 corresponding to each electronic component 340 around the oscillator 220. According to an embodiment, the temperature information may be collected for each designated sample.

In operation 1205, the processor 120 may monitor a temperature change of the peripheral electronic component 340 based on the collected data.

In operation 1207, the processor 120 may predict a temperature change for each electronic component 340. According to an embodiment, the processor 120 may determine a temperature change trend based on data related to each peripheral electronic component 340. According to an embodiment, the processor 120 may predict a future temperature change for each electronic component 340 based on the temperature change trend for each electronic component 340.

In operation 1209, the processor 120 may determine whether an event has occurred. According to an embodiment, the processor 120 may determine whether an event related to the change of the reference electronic component has occurred, based on the predicted temperature change. According to an embodiment, the event may include an event regarding whether there is a temperature change that precedes a future temperature change of the oscillator 220 among the temperature changes of the electronic component 340.

According to an embodiment, in case that there is a preceding temperature change, the processor 120 may determine that an event has occurred. According to an embodiment, in case that there is a temperature change preceding the future temperature change of the oscillator 220 among the temperature changes according to temperature data of the electronic component based on the predicted temperature change, the processor 120 may determine that it is necessary to change the reference electronic component (e.g., an event will occur in a corresponding section in the future). For example, the processor 120 may determine that an event has occurred when there is a section where a temperature inversion phenomenon will occur and determine to change the reference electronic component.

In operation 1209, in case that no event occurs (e.g., "No" in operation 1209), the processor 120 may proceed to operation 1201 and perform operations following operation 1201.

In operation 1209, in case that an event occurs (e.g., "Yes" in operation 1209), the processor 120 may calculate a weight for each electronic component 340 based on the event occurrence in operation 1211. According to an embodiment, the processor 120 may configure a higher weight for the electronic component 340 as the temperature change during unit time is relatively large and the distance is relatively short. According to an embodiment, the processor 120 may configure a lower weight for the electronic component 340 as the temperature change during unit time is small and the distance is long. For example, the weight may be proportional to a difference value ΔT between a maximum value and a minimum value in the temperature data, and may be inversely proportional to a distance D between the electronic component 340 and the oscillator 220.

According to an embodiment, the processor 120 may calculate a weight for each peripheral electronic component 340 based on the above. According to an embodiment, the processor 120 may identify the maximum value Max and the minimum value Min while shifting samples, which have been generated during a predetermined time period (e.g., about 3 seconds or 5 seconds), by one sample at a time with respect to a temperature sensing device for each peripheral electronic component 340 and calculate the difference value based on a difference between the identified maximum value and minimum value. According to an embodiment, the processor 120 may calculate a difference value for each electronic component 340 based on temperature data collected from a temperature sensing device corresponding to each electronic component 340. According to an embodiment, the processor 120 may perform a weight calculation based on the difference value ΔT of the electronic component 340 and the distance D between the preconfigured electronic component 340 and the oscillator 220.

In operation 1213, the processor 120 may determine a weight priority. According to an embodiment, the processor 120 may select a highest weight through the weight calculation for each peripheral electronic component 340 and determine the corresponding weight as a highest priority weight.

In operation 1215, the processor 120 may change the second electronic component corresponding to the highest priority weight to the reference electronic component. According to an embodiment, the processor 120 may select an electronic component having the highest weight among the peripheral electronic components 340. For example, the processor 120 may determine a reference electronic component for temperature information to be referred to for the clock generation operation of the oscillator 220.

In operation 1217, the processor 120 may control an operation of the oscillator 220 based on data (e.g., temperature information) of the second electronic component having been changed to the reference electronic component. According to an embodiment, the processor 120 may share temperature data of the second electronic component with the oscillator 220 so that the oscillator 220 may generate a clock based on the data of the second electronic component. According to an embodiment, the processor 120 may provide (e.g., share) the temperature information of the determined reference electronic component as temperature information to be referred to by the oscillator 220. According to an embodiment, the oscillator 220 may operate to predict a future temperature change based on the temperature information, and generate a clock based on the predicted temperature change.

An operating method performed in the electronic device 101 according to an embodiment may include an operation of collecting temperature data related to a plurality of electronic components from a plurality of temperature sensing devices respectively corresponding to the plurality of electronic components. According to an embodiment, the method may include an operation of predicting a temperature change with respect to the plurality of electronic components based on the collected temperature data. According to an embodiment, the method may include an operation of determining a reference electronic component to be referred to for clock generation of an oscillator based on the predicted temperature change. According to an embodiment, the method may include an operation of controlling clock generation of the oscillator based on temperature data of the determined reference electronic component.

According to an embodiment, the operation of predicting the temperature change may include an operation of determining a temperature change trend for each electronic component based on the temperature data related to each of the plurality of electronic components and an operation of predicting a future temperature change for each electronic component, based on the temperature change trend for each electronic component.

According to an embodiment, the operation of determining the reference electronic component may include an operation of determining an electronic component having a greatest temperature change range as the reference electronic component, based on the predicted temperature change for each of the plurality of electronic components.

According to an embodiment, the operation of controlling the clock generation of the oscillator may include an operation of providing temperature data related to the determined reference electronic component to the oscillator so that the oscillator generates a clock based on the temperature data of the determined reference electronic component.

According to an embodiment, the operating method performed in the electronic device 101 may include an operation of controlling an operation of the oscillator based on first temperature data of a first electronic component having been determined as the reference electronic component, an operation of changing the reference electronic component based on temperature data corresponding to each of the plurality of electronic components, and an operation of controlling an operation of the oscillator based on second temperature data of a second electronic component having been changed to the reference electronic component.

According to an embodiment, the operation of changing the reference electronic component may include an operation of calculating a weight for each of the plurality of electronic components, an operation of determining a weight priority, and an operation of determining the second electronic component corresponding to a highest priority weight as a reference electronic component.

According to an embodiment, the weight may be proportional to the difference between the maximum value and the minimum value in temperature data and may be inversely proportional to a distance between the electronic component and the oscillator.

According to an embodiment, the operation of calculating the weight may include an operation of identifying the maximum value and the minimum value while shifting samples, which have been generated for a predetermined time period, by one sample at a time with respect to a temperature sensing device corresponding to each of the plurality of electronic components, an operation of calculating the difference value based on a difference between the maximum value and the minimum value, an operation of calculating a weight for each electronic component based on the difference value and the distance between the electronic component and the oscillator, and an operation of determining a highest weight among calculated weights for electronic components as the highest priority weight.

According to an embodiment, the operation of changing the reference electronic component may include an operation of determining whether an event related to the change of the reference electronic component has occurred, based on the predicted temperature change, and in case that there is a temperature change that precedes a temperature change of the oscillator among the temperature changes of the plurality of electronic components, an operation of determining a change of the reference electronic component.

According to an embodiment, the event may include an event regarding whether there is a temperature change that precedes a temperature change of the oscillator among the temperature changes of the plurality of electronic components.

According to the electronic device, the operating method thereof, and the non-transitory computer-readable recording medium according to an embodiment of the disclosure, the temperature change of the oscillator may be predicted in advance by referring to most suitable ambient temperature data in various heat generation environments of the electronic device. According to various embodiments of the disclosure, depending on the temperature change of the oscillator, the oscillator may be configured to incur (or oscillate or generate) an accurate clock based on a frequency characteristic suitable for a future temperature range. According to various embodiments of the disclosure, an electronic device may prevent a temperature inversion phenomenon of the oscillator to be suitable for a future temperature range and thereby improve communication performance (e.g., GNSS performance).

According to an embodiment of the disclosure, the most suitable ambient temperature data may be dynamically referred to in various heat generation environments of the electronic device supporting various high-spec functions. According to various embodiments of the disclosure, the electronic device may predict a temperature change of the oscillator in advance based on ambient temperature data, thereby preventing temperature inversion of the oscillator and improving communication performance. According to various embodiments of the disclosure, the temperature inversion phenomenon of the oscillator may be prevented to prevent failure of a communication block (e.g., a GNSS communication block), such as clock drift, cycle slip, and/or bit error rate (BER) failure. According to various embodiments of the disclosure, the accuracy of location calculation of the electronic device may be increased by causing the oscillator to generate a more accurate clock.

In addition, various effects directly or indirectly identified through the disclosure may be provided. It will be appreciated by a person skilled in the art that effects which may be achieved from the disclosure are not limited to the effects described above and other effects that are not described above will be clearly understood from the following detailed description.

While embodiments have been described with reference to the figures, it will be understood by those of ordinary skill in the art that various changes in form and details may be made therein without departing from the spirit and scope as defined by the following claims and their equivalents.

What is claimed is:

1. An electronic device comprising:
a communication circuit;
an oscillator configured to generate a clock corresponding to the communication circuit;
a plurality of electronic components adjacent to the oscillator;

a plurality of temperature sensing devices corresponding to the plurality of electronic components, respectively; and
a processor connected to the communication circuit, the oscillator, the electronic components, and the temperature sensing devices,
wherein the processor is configured to:
collect, from the plurality of temperature sensing devices, temperature data corresponding to the plurality of electronic components;
predict a temperature change corresponding to the plurality of electronic components based on the collected temperature data;
determine a reference electronic component to be referred to by the oscillator for clock generation, based on the predicted temperature change; and
control the clock generation of the oscillator based on temperature data of the determined reference electronic component.

2. The electronic device of claim 1, wherein the processor is further configured to collect the temperature data from the plurality of temperature sensing devices for each designated sample.

3. The electronic device of claim 1, wherein the processor is further configured to:
determine a temperature change trend for each electronic component among the plurality of electronic components based on the temperature data corresponding to each of the plurality of electronic components; and
predict a future temperature change for each electronic component among the plurality of electronic components based on the temperature change trend for each electronic component.

4. The electronic device of claim 1, wherein the processor is further configured to determine an electronic component among the plurality of electronic components having a greatest temperature change range as the reference electronic component, based on the predicted temperature change corresponding to each electronic component among the plurality of electronic components.

5. The electronic device of claim 1, wherein the processor is further configured to provide temperature data corresponding to the determined reference electronic component to the oscillator so that the oscillator is configured to generate a clock based on the temperature data of the determined reference electronic component.

6. The electronic device of claim 5, wherein the oscillator is further configured to:
predict a future temperature change based on the temperature data from the processor; and
generate a clock based on the predicted temperature change.

7. The electronic device of claim 1, wherein the processor is further configured to:
control an operation of the oscillator based on first temperature data of a first electronic component having been designated as the reference electronic component;
change the reference electronic component based on temperature data corresponding to each electronic component among the plurality of electronic components; and
control an operation of the oscillator based on second temperature data of a second electronic component having been changed to a reference electronic component.

8. The electronic device of claim 7, wherein the processor is further configured to:

obtain a weight for each electronic component of the plurality of electronic components;

determine a weight priority; and determine the second electronic component corresponding to a highest priority weight as a reference electronic component, and wherein the weight is proportional to a difference value between a maximum value and a minimum value in temperature data and inversely proportional to a distance between the oscillator and each of the electronic components.

9. The electronic device of claim 8, wherein the processor is further configured to:

obtain the maximum value and the minimum value while shifting samples one sample at a time, the samples having been generated for a predetermined time period with respect to the temperature sensing devices corresponding to the plurality of electronic components, respectively;

obtain the difference value based on a difference between the maximum value and the minimum value;

obtain a weight for each electronic component among the plurality of electronic components based on the difference value and the distance between each electronic component and the oscillator; and determine a highest weight among the obtained weights for respective electronic components as the highest priority weight.

10. The electronic device of claim 7, wherein the processor is further configured to:

determine whether an event corresponding to a change of the reference electronic component has occurred based on the predicted temperature change; and determine a change of the reference electronic component based on a temperature change preceding a temperature change of the oscillator among temperature changes of the plurality of electronic components, and wherein the event comprises an event corresponding to a temperature change preceding a future temperature change of the oscillator among the temperature changes of the plurality of electronic components.

11. An operating method of an electronic device, the method comprising:

collecting temperature data corresponding to a plurality of electronic components from a plurality of temperature sensing devices corresponding to the plurality of electronic components, respectively;

predicting a temperature change with respect to the plurality of electronic components based on the collected temperature data;

determining a reference electronic component to be referred to for clock generation of an oscillator based on the predicted temperature change; and controlling clock generation of the oscillator based on temperature data of the determined reference electronic component.

12. The method of claim 11, wherein the predicting of the temperature change comprises:

determining a temperature change trend for each electronic component among the plurality of electronic components based on the temperature data corresponding to each electronic component among the plurality of electronic components; and predicting a future temperature change for each electronic component among the plurality of electronic components based on the temperature change trend for each electronic component.

13. The method of claim 11, wherein the determining of the reference electronic component comprises determining an electronic component among the plurality of electronic components having a greatest temperature change range as the reference electronic component, based on the predicted temperature change for each electronic component among the plurality of electronic components.

14. The method of claim 11, wherein the controlling of the clock generation of the oscillator comprises providing temperature data corresponding to the determined reference electronic component to the oscillator so that the oscillator is configured to generate a clock based on the temperature data of the determined reference electronic component.

15. The method of claim 11, further comprising:

controlling an operation of the oscillator based on first temperature data of a first electronic component having been designated as the reference electronic component;

changing the reference electronic component based on temperature data corresponding to each electronic component among the plurality of electronic components; and controlling an operation of the oscillator based on second temperature data of a second electronic component having been changed to the reference electronic component.

16. The method of claim 11, further comprising collecting the temperature data for each designated sample.

17. The method of claim 11, further comprising:

predicting, by an oscillator, a future temperature change based on the temperature data; and generating a clock based on the predicted temperature change.

18. The method of claim 15, further comprising:

obtaining a weight for each electronic component of the plurality of electronic components;

determining a weight priority; and determining the second electronic component corresponding to a highest priority weight as a reference electronic component, and wherein the weight is proportional to a difference value between a maximum value and a minimum value in temperature data and inversely proportional to a distance between the oscillator and each of the electronic components.

19. The method of claim 18, further comprising:

obtaining the maximum value and the minimum value while shifting samples one sample at a time, the samples having been generated for a predetermined time period with respect to the temperature sensing devices corresponding to the plurality of electronic components, respectively;

obtaining the difference value based on a difference between the maximum value and the minimum value;

obtaining a weight for each electronic component among the plurality of electronic components based on the difference value and the distance between each electronic component and the oscillator; and determining a highest weight among the obtained weights for respective electronic components as the highest priority weight.

20. The method of claim 15, further comprising:

determining whether an event corresponding to a change of the reference electronic component has occurred based on the predicted temperature change; and determining a change of the reference electronic component based on a temperature change preceding a temperature change of the oscillator among temperature changes of the plurality of electronic components, and wherein the event comprises an event corresponding to a temperature change preceding a future temperature change of the oscillator among the temperature changes of the plurality of electronic components.

\* \* \* \* \*